United States Patent [19]

Inoue et al.

[11] Patent Number: 5,779,918

[45] Date of Patent: Jul. 14, 1998

[54] METHOD FOR MANUFACTURING A PHOTO-SENSOR

[75] Inventors: Keijiro Inoue, Kariya; Inao Toyoda; Yasutoshi Suzuki, both of Okazaki, all of Japan

[73] Assignee: Denso Corporation, Kariya, Japan

[21] Appl. No.: 800,325

[22] Filed: Feb. 14, 1997

[30] Foreign Application Priority Data

Feb. 14, 1996 [JP] Japan .................................. 8-026985
Jul. 11, 1996 [JP] Japan .................................. 8-182499
Dec. 4, 1996 [JP] Japan .................................. 8-324428

[51] Int. Cl.$^6$ ............................. H01L 21/00; B44C 1/22
[52] U.S. Cl. ..................... 216/2; 216/39; 216/65; 438/57; 438/708
[58] Field of Search .............................. 216/2, 24, 33, 216/39, 56, 65, 67, 76, 77; 438/57, 73, 707, 708, 710, 709, 723; 219/121.68, 121.69

[56] References Cited

U.S. PATENT DOCUMENTS 4,009,058  2/1977  Mills ..................................... 438/57

FOREIGN PATENT DOCUMENTS 63-116458  5/1988  Japan .
63-274174  11/1988  Japan .
7-030091   1/1995  Japan .

OTHER PUBLICATIONS

Z. Tani: "Opto–Device Applied Know–How", pp. 48–57, with English abstract.

*Primary Examiner*—William Powell

*Attorney, Agent, or Firm*—Cushman Darby & Cushman IP Group of Pillsbury Madison & Sutro LLP

[57] ABSTRACT

A photoelectric transfer device having a light receiving element and a signal processing circuit are formed in a semiconductor substrate, a silicon oxide film is formed on the light receiving element, a first aluminum thin film is deposited on the silicon substrate, and the first aluminum thin film is patterned to make a wire connected with the signal processing circuit and a protective film placed on the silicon oxide film. Thereafter, an inter-layer insulating film is deposited on the silicon substrate while covering the protective film, a portion of the inter-layer insulating film placed on the protective film is etched and removed, a second aluminum thin film is deposited on the inter-layer insulating film and the protective film, and a portion of the second aluminum thin film placed on the protective film and the protective film are successively etched and removed. Because the inter-layer insulating film placed above the light receiving element is removed, an insulating film placed on the light receiving element is not thinned, so that sensitivity of the photoelectric transfer device can be improved. Also, because the protective film is arranged on the silicon oxide film when the portion of the inter-layer insulating film is etched, the silicon oxide film is not etched, so that a film thickness of the silicon oxide film can be correctly set to a desired value.

18 Claims, 29 Drawing Sheets

METHOD FOR MANUFACTURING A PHOTO-SENSOR

BACKGROUND OF THE INVENTION

1. Field of the Invention

The present invention relates to a method for manufacturing a photo-sensor in which light received in a light receiving element through an insulating film is converted into a photoelectric current in a photoelectric transfer device and the photoelectric current is processed in a signal processing circuit.

2. Description of the Related Art

2.1. Previously Proposed Art

A photo-sensor has been recently used for an air-conditioning control or a control of lighting apparatus. To downsize the photo-sensor and reduce the number of parts in the photo-sensor, a photo-sensor integrated circuit (IC) having a light-receiving element (or a photo diode) and a signal processing circuit (or a transistor) arranged on the same chip is known. In this photo-sensor IC, it is required to arrange a shielding element on the signal processing circuit to prevent a malfunction of the signal processing circuit caused by an influence of incoming light. Therefore, as shown in FIG. 1, a circuit region corresponding to an NPN transistor 70 of a photo sensor is covered with a shielding film 71. That is, as shown in FIG. 2, a plurality of circuit wirings (or a plurality of first metal layers) 72 are arranged on the NPN transistor 70. Thereafter, as shown in FIG. 3, an inter-layer insulating film 73 is arranged on the circuit wirings (or the first metal layers) 72. Thereafter, as shown in FIG. 1, a second metal layer 71 functioning as the shielding film is arranged on the inter-layer insulating film 73. For example, this technique is disclosed in a literature "Opto-Device Applied Know-How" written by Zenpei Tani, CQ publishing company, first revised edition, pp. 56.

2.2. Problems to be Solved by the Invention

However, because the inter-layer insulating film 73 is formed after the formation of the metal layer 72, the inter-layer insulating film 73 cannot be formed on the metal layer according to a thermal oxidation processing. That is, an $SiO_2$ film cannot be formed on the metal layer 72 as the inter-layer insulating film 73 because the thermal oxidation processing is required for the formation of the $SiO_2$ film. Therefore, a low temperature deposit film made of $SiO_2$ is formed on the metal layer 72 as the inter-layer insulating film 73 according to a chemical vapor deposition (CVD). However, the $SiO_2$ film formed according to a CVD processing cannot be correctly set to a desired film thickness as compared with a film thickness of the $SiO_2$ film formed according to the thermal oxidation processing. Therefore, transmissivity of light transmitting through the inter-layer insulating film 73 changes each time one $SiO_2$ film is formed according to the CVD processing, and a light-receiving characteristic of the photo-sensor fluctuates in a large-scale manufacturing.

For example, a film thickness of 1 μm is required to obtain a superior insulation performance. Therefore, when an unevenness degree of film thicknesses of a plurality of inter-layer insulating films 73 is 10%, an unevenness of the film thicknesses of the inter-layer insulating films 73 is 1000 Å, so that the transmissivity of light changes for each photo-sensor, and the light-receiving characteristic of the photo-sensor fluctuates.

Also, because the inter-layer insulating film 73 is arranged on a light-receiving element of a photo-transistor, an insulating film arranged on the light-receiving element is thickened. Therefore, a volume of light incident on the light-receiving element of the photo-transistor is reduced, and a sensitivity of the photo-transistor for the incident light is degraded.

To prevent that an insulating film arranged on the light-receiving element is thickened, a Published Unexamined Japanese Patent Application No. S63-116458 (1988) is disclosed. In this application, an inter-layer insulating film and a protective film which are arranged on an insulating film (or an oxide film) arranged on a light-receiving element of a photo-transistor are made of a material (for example, polyimide) which is etched by a particular etchant different from that used for etching the insulating film (or the oxide film). Therefore, when the inter-layer insulating film and the protective film arranged on the insulating film (or the oxide film) are etched by the particular etchant, the insulating film (or the oxide film) can remain on the light-receiving element of the photo-transistor. However, an oxide film including impurity such as BPSG (boro-phospho-silicate glass) or PSG (phospho-silicate glass) including $SiO_2$, B (boron) and P (phosphorus) is normally used as a material of the inter-layer insulating film, an etching selection ratio of the inter-layer insulating film to the insulating film (or the oxide film) arranged on the light-receiving element is lowered, so that the insulating film (or the oxide film) arranged on the light-receiving element is etched when the inter-layer insulating film is etched. Therefore, material of the inter-layer insulating film and the protective film is limited because a condition that an etching selection ratio of the inter-layer insulating film to the insulating film (or the oxide film) is superior is required, a design freedom degree is lowered.

SUMMARY OF THE INVENTION

An object of the present invention is to provide, with due consideration to the drawbacks of such a conventional method for manufacturing a photo-sensor, a method for manufacturing a photo-sensor in which a light-receiving characteristic and sensitivity of a photoelectric transfer device (or a photo diode) are improved and a degree of freedom in design is superior.

The object is achieved by the provision of a method for manufacturing a photo-sensor in which light received in a light receiving element is converted into a photoelectric current in a photoelectric transfer device and the photoelectric current is processed in a signal processing circuit, comprising the steps of;

forming the photoelectric transfer device having the light receiving element in a semiconductor substrate;

forming the signal processing circuit in the semiconductor substrate;

forming a first insulating film on the light receiving element of the photoelectric transfer device;

forming a first metallic film, which is made of a metallic material different from a material of the first insulating film, on the semiconductor substrate to cover the signal processing circuit and the first insulating film with the first metallic film;

patterning the first metallic film to make a wire connected with the signal processing circuit and a protective film arranged on the first insulating film;

forming a second insulating film on the semiconductor substrate to cover the signal processing circuit, the wire and the protective film made of the patterned first metallic film with the second insulating film;

removing a portion of the second insulating film placed on the protective film;

forming a second metallic film on the semiconductor substrate to cover the second insulating film and the protective film with the second metallic film;

etching a portion of the second metallic film placed on the protective film to remove the portion of the second metallic film; and etching the protective film arranged on the first insulating film to remove the protective film.

In a conventional method for manufacturing a conventional photo-sensor, because an inter-layer insulating film is arranged on a light receiving element of a photoelectric transfer device, the inter-layer insulating film arranged on the light receiving element is undesirably thickened.

In contrast, in the above photo-sensor manufacturing method according to the present invention (claim 1), because a portion of the second insulating film, which is arranged on the light receiving element and functions as an inter-layer insulating film, is removed, there is no probability that the insulating film (or the first insulating film) arranged on the light receiving element is thickened.

Accordingly, the insulating film arranged on the light receiving element of the photoelectric transfer device can be thinned, so that a light-receiving characteristic and sensitivity of the photoelectric transfer device for light incident on the light receiving element can be improved.

Also, when a portion of the second insulating film placed above the light receiving element is etched and removed, the first insulating film arranged on the light receiving element is not etched with the portion of the second insulating film because a portion of the first metallic film is arranged as a protective film on the first insulating film. Therefore, the first insulating film is not thinned even though the portion of the second insulating film is etched and removed, so that a film thickness of the first insulating film can be set at a desired value. In other words, even though a plurality of photo-sensors are manufactured in a large-scale manufacturing, a plurality of first insulating films of the photo-sensors can have the same film thickness. Therefore, a light receiving characteristic of the photo-sensor can be improved.

Also, because a portion of the second insulating film placed on the protective film is etched and removed on condition that the first insulating film is protected by the protective film, the first insulating film is not damaged in the etching operation for the second insulating film.

Also, in the conventional photo-sensor shown in FIG. 1, assuming that the inter-layer insulating film 73 arranged on a light-receiving element of a photoelectric transfer device is etched to thin the inter-layer insulating film 73, the etching operation is finished in cases where it is assumed that the inter-layer insulating film 73 is thinned to a prescribed film thickness because the etching operation is performed for a predetermined time. However, it is difficult to stably set a film thickness of the inter-layer insulating film 73 etched in the etching operation. In contrast, in the present invention, because the first metallic film, which is made of a metallic material different from a material of the first insulating film is arranged on the first insulating film as the protective film, the protective film made of the metallic material can be selectively etched without etching the first insulating film arranged under the protective film. Therefore, the protective film can be removed while remaining the first insulating film on the light receiving element, and a film thickness of the first insulating film can be easily set to a desired value.

Also, because a portion of the second insulating film placed above the light receiving element is etched and removed on condition that the first insulating film is covered with the protective film made of the metallic material, even though a material of the second insulating film is the same as that of the first insulating film, the portion of the second insulating film can be removed without etching the first insulating film. Therefore, the second insulating film can be made of the same material as that of the first insulating film, and a degree of freedom in design is superior. For example, the first and second insulating films can be respectively made of a silicon oxide material.

Also, the etching of a portion of the second metallic film placed on the protective film and the etching of the protective film can be successively performed. That is, the protective film can be successively removed after the portion of the second metallic film is removed.

The object is also achieved by the provision of a method for manufacturing a photo-sensor in which light received in a light receiving element is converted into a photoelectric current in a photoelectric transfer device and the photoelectric current is processed in a signal processing circuit, comprising the steps of;

forming the photoelectric transfer device having the light receiving element in a semiconductor substrate;

forming the signal processing circuit in the semiconductor substrate;

forming a first insulating film on the light receiving element of the photoelectric transfer device;

forming a first metallic film, which is made of a metallic material different from a material of the first insulating film, on the semiconductor substrate to cover the signal processing circuit and the first insulating film with the first metallic film;

patterning the first metallic film to make a wire connected with the signal processing circuit and a protective film arranged on the first insulating film;

forming a second insulating film on the semiconductor substrate to cover the signal processing circuit, the wire and the protective film made of the patterned first metallic film with the second insulating film;

forming a second metallic film on the second insulating film;

etching a portion of the second metallic film placed above the light receiving element to remove the portion of the second metallic film; and etching a portion of the second insulating film placed above the light receiving element and the protective film placed above the light receiving element to remove the portion of the second insulating film and the protective film.

In a conventional method for manufacturing a conventional photo-sensor, because an inter-layer insulating film is arranged on a light receiving element of a photoelectric transfer device, the inter-layer insulating film arranged on the light receiving element is undesirably thickened.

In contrast, in the above photo-sensor manufacturing method according to the present invention (claim 2), because a portion of the second insulating film, which is arranged on the light receiving element and functions as an inter-layer insulating film, is removed, there is no probability that the insulating film (or the first insulating film) arranged on the light receiving element is thickened.

Accordingly, the insulating film arranged on the light receiving element of the photoelectric transfer device can be thinned, so that a light-receiving characteristic and sensitivity of the photoelectric transfer device for light incident on the light receiving element can be improved.

Also, when a portion of the second insulating film placed above the light receiving element is etched and removed, the first insulating film arranged on the light receiving element is not etched with the portion of the second insulating film because a portion of the first metallic film is arranged as a protective film on the first insulating film. Therefore, the first insulating film is not thinned even though the portion of the second insulating film is etched and removed, so that a film thickness of the first insulating film can be set at a desired value. In other words, even though a plurality of photosensors are manufactured in a large-scale manufacturing, a plurality of first insulating films of the photo-sensors can have the same film thickness. Therefore, a light receiving characteristic of the photo-sensor can be improved.

Also, because a portion of the second insulating film placed on the protective film is etched and removed on condition that the first insulating film is protected by the protective film, the first insulating film is not damaged in the etching operation for the second insulating film.

Also, in the conventional photo-sensor shown in FIG. 1, assuming that the inter-layer insulating film 73 arranged on a light-receiving element of a photoelectric transfer device is etched to thin the inter-layer insulating film 73, the etching operation is finished in cases where it is assumed that the inter-layer insulating film 73 is thinned to a prescribed film thickness because the etching operation is performed for a predetermined time. However, it is difficult to stably set a film thickness of the inter-layer insulating film 73 etched in the etching operation. In contrast, in the present invention, because the first metallic film, which is made of a metallic material different from a material of the first insulating film is arranged on the first insulating film as the protective film, the protective film made of the metallic material can be selectively etched without etching the first insulating film arranged under the protective film. Therefore, the protective film can be removed while remaining the first insulating film on the light receiving element, and a film thickness of the first insulating film can be easily set to a desired value.

That is, the effects obtained in the manufacturing method of the claim 2 are the same as those obtained in the manufacturing method of the claim 1.

It is preferred that a laser trim adjusting thin-film resistive element be additionally arranged on the semiconductor substrate of the photo-sensor manufactured according to the manufacturing method of the claim 1, the second insulating film and the second metallic film be additionally formed on the laser trim adjusting thin-film resistive element in that order, a third insulating film be formed on the second metallic film, a first portion of the third insulating film placed above the light receiving element and a second portion of the third insulating film placed above the laser trim adjusting thin-film resistive element be removed, and a second portion of the second metallic film placed above the laser trim adjusting thin-film resistive element be etched and removed.

In the above steps according to a manufacturing method of a claim 3, the second portion of the third insulating film placed above the laser trim adjusting thin-film resistive element is etched and removed on condition that a portion of the second insulating film placed on the laser trim adjusting thin-film resistive element is protected by the second metallic film. Therefore, there is no probability that the second insulating film placed on the laser trim adjusting thin-film resistive element is undesirably etched when the second portion of the third insulating film placed above the laser trim adjusting thin-film resistive element is etched.

Also, a portion of the second insulating film placed on the laser trim adjusting thin-film resistive element is not etched when the second portion of the second metallic film placed above the laser trim adjusting thin-film resistive element is etched.

Therefore, a trimming operation for the laser trim adjusting thin-film resistive element can be stably performed because a film thickness of the second insulating film placed on the laser trim adjusting thin-film resistive element is set to a desired value.

A reason that the second metallic film is arranged above the laser trim adjusting thin-film resistive element not to etch the second insulating film placed on the laser trim adjusting thin-film resistive element when the third insulating film placed above the laser trim adjusting thin-film resistive element is etched is described. A YLF (LiYF$_4$) laser having a wavelength of 1.048 μm or a YAG (yttrium aluminum garnet) laser having a wavelength of 1.06 μm is radiated to the laser trim adjusting thin-film resistive element, and the laser trim adjusting thin-film resistive element is trimmed. In this trimming operation, the laser trim adjusting thin-film resistive element is arranged between a pair of insulating films, and film thicknesses of the insulating films influence on the trimming operation. Therefore, in cases where a film thickness of the insulating film placed on the laser trim adjusting thin-film resistive element is not correctly set to a predetermined value, there is a problem that a trimming operation for the laser trim adjusting thin-film resistive element cannot be stably performed. That is, assuming that the second insulating film placed on the laser trim adjusting thin-film resistive element is etched when the second portion of the third insulating film placed above the laser trim adjusting thin-film resistive element is etched, a film thickness of the second insulating film placed on the laser trim adjusting thin-film resistive element shifts from a desired value. Therefore, when a plurality of photo-sensors are manufactured in a large scale manufacturing, a plurality of second insulating films have various film thicknesses different from each other, so that a plurality of laser trim adjusting thin-film resistive elements cannot be uniformly trimmed. To prevent this drawback, it is required that the second insulating film placed on the laser trim adjusting thin-film resistive element is not etched when the second portion of the third insulating film placed above the laser trim adjusting thin-film resistive element is etched. In detail, the second insulating film is formed of an oxide film such as a silicon oxide film, the third insulating film is formed of a silicon nitride film functioning as a passivation film, and the third insulating film is removed according to a dry etching usually using CF$_4$ gas. In this case, the second insulating film formed of the silicon oxide film is also etched according to the dry etching using CF$_4$ gas when the second insulating film is exposed to the CF$_4$ gas. Therefore, assuming that the second metallic film is not arranged on the second insulating film, the second insulating film is undesirably etched when the third insulating film is etched. Therefore, in the present invention, the second metallic film is used for the second insulating film as a resist-etching film when the third insulating film is etched, so that the etching of the second insulating film can be prevented. Therefore, it is not required that the second insulating film is made of a special material not etched by the CF$_4$ gas, and the second insulating film can be made of a material etched by the CF$_4$ gas in the same manner as a material of the third insulating film. Accordingly, a degree of freedom in design is superior in the present invention.

Also, in the manufacturing method according to the claim 3, it is preferred that the portion of the second insulating film placed above the light receiving element and the second portion of the second metallic film placed above the laser trim adjusting thin-film resistive element be simultaneously etched. Because the portions of the second insulating film placed above the light receiving element and the laser trim adjusting thin-film resistive element are removed in the same etching operation, the manufacturing method can be easily performed.

Also, it is preferred that a laser trim adjusting thin-film resistive element be additionally arranged on the semiconductor substrate of the photo-sensor manufactured according to the manufacturing method of the claim 2, the second insulating film and the second metallic film be additionally formed on the laser trim adjusting thin-film resistive element in that order, a second portion of the second metallic film placed above the laser trim adjusting thin-film resistive element be not removed when the portion of the second metallic film placed above the light receiving element is etched, a third insulating film be formed on the second metallic film, a first portion of the third insulating film placed above the light receiving element and a second portion of the third insulating film placed above the laser trim adjusting thin-film resistive element be etched, and a second portion of the second metallic film placed above the laser trim adjusting thin-film resistive element be additionally etched when the portion of the second metallic film placed above the light receiving element is etched.

In the above steps according to a manufacturing method of a claim 5, the second portion of the third insulating film placed above the laser trim adjusting thin-film resistive element is etched on condition that a portion of the second insulating film placed on the laser trim adjusting thin-film resistive element is protected by the second metallic film, and the second metallic film placed above the laser trim adjusting thin-film resistive element is etched. Therefore, a trimming operation for the laser trim adjusting thin-film resistive element can be stably performed in the same manner as in the claim 3.

Also, in the manufacturing method according to the claim 5, it is preferred that the portion of the first metallic film placed above the light receiving element and the second portion of the second metallic film placed above the laser trim adjusting thin-film resistive element be simultaneously etched and removed. Because the portion of the first metallic film and the second portion of the second metallic film are removed in the same etching operation, the manufacturing method can be easily performed.

Also, it is preferred that the first insulating film be formed by thermally oxidizing a portion of the semiconductor substrate placed on the light receiving element of the photoelectric transfer device. In this case, because a thermal oxide film is formed on the light receiving element as the first insulating film, in cases where a plurality of first insulating films are formed in a large scale manufacturing, the first insulating films can be uniformly set to the same film thickness as compared with a plurality of first insulating films formed according to a CVD method.

Also, it is preferred that the first metallic film be made of a material possible to be etched by a particular etching means and the second metallic film be made of the same material or another material possible to be etched by the particular etching means. In this case, because the first and second metallic films are etched by the same etchant or the same dry etching particle, the first and second metallic films can be easily etched.

Also, it is preferred that a material of the first metallic film be the same as that of the second metallic film. In this case, because the first and second metallic films can be etched in the same etching method, the first and second metallic films can be easily etched.

The object is also achieved by the provision of a method for manufacturing a photo-sensor in which light received in a light receiving element is converted into a photoelectric current in a photoelectric transfer device and the photoelectric current is processed in a signal processing circuit, comprising the steps of;

forming the photoelectric transfer device having the light receiving element in a semiconductor substrate;

forming the signal processing circuit in the semiconductor substrate;

forming a first insulating film on the light receiving element of the photoelectric transfer device;

forming a first metallic film on the semiconductor substrate to cover the signal processing circuit and the first insulating film with the first metallic film;

patterning the first metallic film to make a wire connected with the signal processing circuit and a protective film arranged on the first insulating film;

forming a second insulating film on the semiconductor substrate to cover the signal processing circuit, the wire and the protective film with the second insulating film;

forming a second metallic film on the second insulating film; and exposing the first insulating film, the step of exposing the first insulating film comprising the steps of
etching a portion of the second metallic film placed above the light receiving element to remove the portion of the second metallic film,
etching a portion of the second insulating film placed above the light receiving element to remove the portion of the second insulating film, and
etching the protective film placed on the first insulating film to remove the protective film.

In the above steps, a light-receiving characteristic and sensitivity of a photoelectric transfer device can be improved in the same manner as in the invention of the claims 1 and 2.

Also, a degree of freedom in design is superior. Also, the object is achieved by the provision of a method for manufacturing a photo-sensor, comprising the steps of;

forming a photoelectric transfer device having a light receiving element in a semiconductor substrate;

forming an insulating film on the light receiving element; and setting a film thickness of the insulating film to a particular peak value other than a maximum-peak value on condition that a light transmittance of light transmitting through the insulating film set to a film thickness of the maximum-peak value is maximized according to a relationship between the light transmittance and the film thickness of the insulating film and the light transmittance in the neighborhood of the particular peak value gradually decreases as the film thickness of the insulating film becomes far from the particular peak value.

In general, in cases where a film thickness of the insulating film placed on the light receiving element is targeted for the maximum-peak value and the film thickness of the insulating film actually formed shifts from the maximum-peak value to a slight degree, because the light transmittance of light transmitting through the insulating film is rapidly changed in the neighborhood of the maximum-peak value, a light transmittance actually obtained considerably shifts from a designed light transmittance, so that a light receiving characteristic of the photo-sensor considerably changes.

In contrast, the light transmittance gradually changes in the neighborhood of the particular peak value. Therefore, in cases where the film thickness of the insulating film is targeted for the particular peak value, even though the film thickness of the insulating film actually formed shifts from the particular peak value, a difference between a light transmittance actually obtained and a designed light transmittance is small, so that the change of the light receiving characteristic of the photo-sensor is small.

Accordingly, a light-receiving characteristic and sensitivity of the photoelectric transfer device can be improved.

BRIEF DESCRIPTION OF THE DRAWINGS

The objects, features and advantages of the present invention will be apparent from the following description taken in conjunction with the accompanying drawings, in which.

DETAILED DESCRIPTION OF THE EMBODIMENTS

Preferred embodiments of a photo-sensor according to the present invention are described with reference to drawings.
(First Embodiment)

Figure 4:
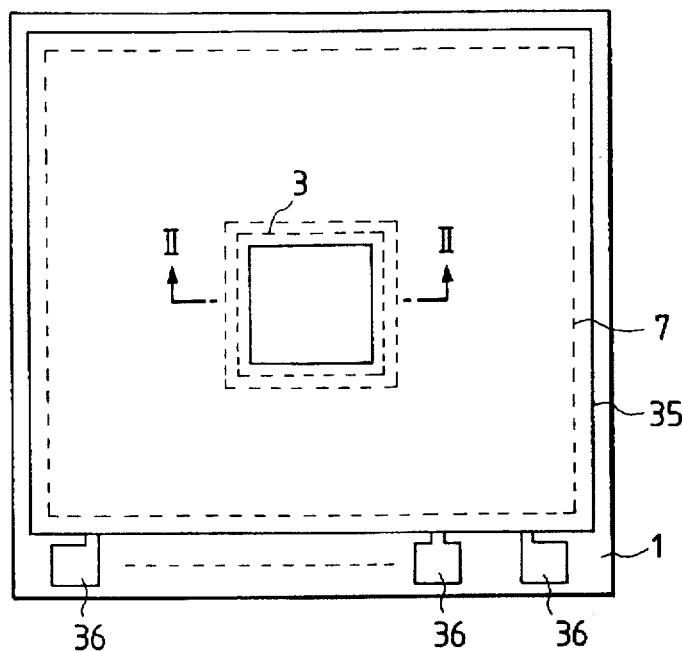
FIG. 4 is a plan view of a photo-sensor manufactured according to a first embodiment of the present invention.
Figure 5:
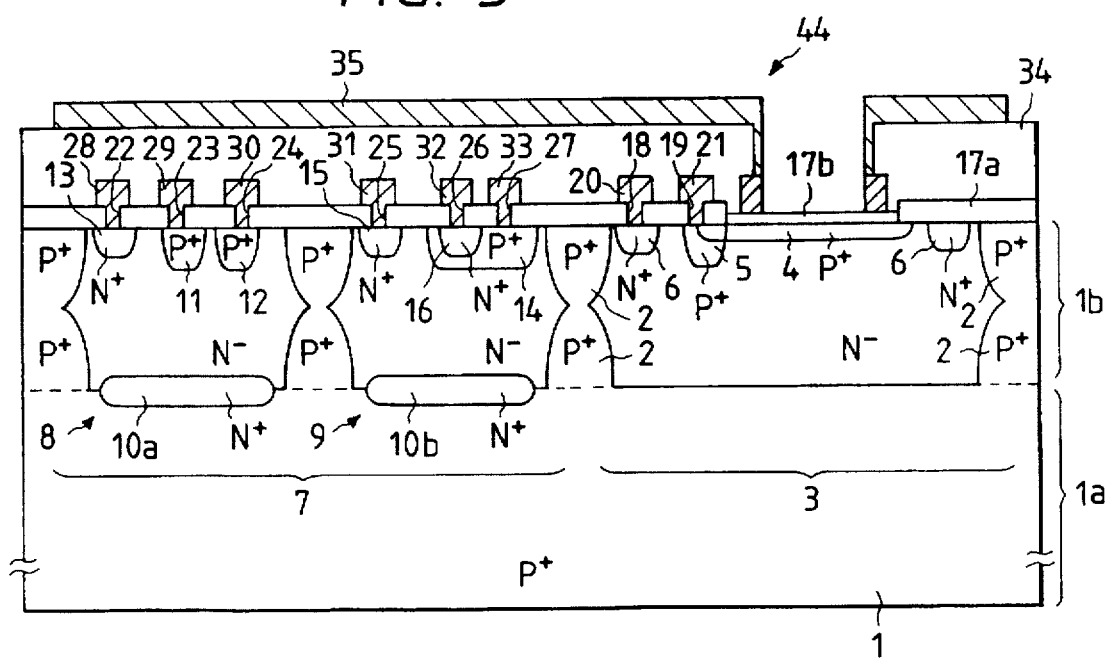
FIG. 5 is a cross sectional view taken generally along a line II—II of FIG. 4.

FIG. 4 is a plan view of a photo-sensor manufactured according to a first embodiment of the present invention, and FIG. 5 is a cross sectional view taken generally along a line II—II of FIG. 4.

As shown in FIGS. 4 and 5, in a photo-sensor 44, a silicon substrate 1 functioning as a semiconductor substrate comprises a P$^+$ type silicon substrate 1a and an N$^-$ type epitaxial layer 1b arranged on the P$^+$ type silicon substrate 1a. A photo diode device 3 isolated by a P$^+$ type region 2 is arranged in the central portion of the silicon substrate 1 and functions as a photoelectric transfer device. In the photo diode device 3, a P$^+$ type region 4 is arranged in a surface portion of the N$^-$ type epitaxial layer 1b and functions as a light receiving element, and a P$^+$ type region 5 is arranged in a peripheral portion of the P$^+$ type region 4. Also, in the photo diode device 3, an N$^+$ type region 6 formed in a ring shape is arranged in the N$^-$ type epitaxial layer 1b to surround the P$^+$ type region 4.

A signal processing circuit device 7 is arranged in the silicon substrate 1 to surround the photo diode device 3, and a large number of semiconductor devices are arranged in the signal processing circuit device 7. A signal amplifying circuit and an A/D converting circuit are composed of the semiconductor devices. As an example, a PNP bipolar transistor 8 and an NPN bipolar transistor 9 are shown in FIG. 5. That is, an N$^+$ type buried layer 10a is arranged in a boundary portion between the P$^+$ type silicon substrate 1a and the N$^-$ type epitaxial layer 1b, and a pair of P$^+$ type regions 11 and 12 and an N$^+$ type region 13 are arranged in a surface layer portion of the N$^-$ type epitaxial layer 1b. Therefore, the PNP bipolar transistor 8 comprises the P$^+$ type regions 11 and 12 and the N$^+$ type region 13. Also, an N$^+$ type buried layer 10b is arranged in a boundary portion between the P$^+$ type silicon substrate 1a and the N$^-$ type epitaxial layer 1b, a P$^+$ type region 14 and an N$^+$ type region 15 are arranged in a surface layer portion of the N$^-$ type epitaxial layer 1b, and an N$^+$ type region 16 is arranged in the P$^+$ type region 14. Therefore, the NPN bipolar transistor 9 comprises the P$^+$ type region 14 and the N$^+$ type regions 15 and 16.

A silicon oxide film 17a is arranged on an upper surface of the silicon substrate 1. The silicon oxide film 17a is opened on the photo diode device 3, and a thin silicon oxide film 17b denoting a first insulating film is arranged in the opening portion of the silicon oxide film 17a to be placed on the P$^+$ type region 4 functioning as the light receiving element of the photo diode device 3. The silicon oxide film 17b is formed by performing a thermal oxidation processing for an upper surface of the silicon substrate 1 exposed to the opening portion, and it is preferred that a film thickness of the silicon oxide film 17b range from 1000 to 3000 Å. In this embodiment, a film thickness of the silicon oxide film 17b is 1100 Å.

Also, a pair of opening portions 18 and 19 are formed in the silicon oxide film 17a of the photo diode device 3, an aluminum wire 20 is electrically connected with the N$^+$ type region 6 through the opening portion 18, and an aluminum wire 21 is electrically connected with the P$^+$ type region 5 through the opening portion 19. The aluminum wires 20 and 21 are respectively formed by patterning an aluminum thin film in a desired shape.

In addition, a plurality of opening portions 22, 23, 24, 25, 26 and 27 are formed in the silicon oxide film 17a of the signal processing circuit device 7, and the opening portions 22 to 27 are buried with a plurality of aluminum wires 28, 29, 30, 31, 32 and 33. The aluminum wire 28 is electrically connected with the N$^+$ type region 13 through the opening portion 22, the aluminum wire 29 is electrically connected with the P$^+$ type region 11 through the opening portion 23, the aluminum wire 30 is electrically connected with the P$^+$ type region 12 through the opening portion 24, the aluminum wire 31 is electrically connected with the N$^+$ type region 15 through the opening portion 25, the aluminum wire 32 is electrically connected with the N$^+$ type region 16 through the opening portion 26, and the aluminum wire 33 is electrically connected with the P$^+$ type region 14 through the opening portion 27. The aluminum wires 28 and 33 are respectively formed by patterning an aluminum thin film in a desired shape.

An inter-layer insulating film 34 denoting a second insulating film is arranged on the silicon oxide film 17a to cover the aluminum wires 20, 21 and 28 to 33. The inter-layer insulating film 34 is obtained by laminating a silicon oxide film and a silicon nitride film and functions as a protective film placed on the signal processing circuit device 7. Also, an aluminum thin film 35 is arranged on the inter-layer insulating film 34 and functions as a shielding film. The inter-layer insulating film 34 and the aluminum thin film 35 are opened on the photo diode device 3 to receive light.

That is, when light is incident in the opening portion of the photo diode device 3, the light passes through the thin silicon oxide film 17b and reaches the P$^+$ type region 4 functions as the light receiving element of the photo diode device 3. Thereafter, when the light is incident in the neighborhood of a PN junction between the N$^-$ type epitaxial layer 1b and the P$^+$ type region 4, a plurality of electrons and holes occur in pairs in the neighborhood of the PN junction. In this case, the electrons generated in the P$^+$ type region 4 as a minority carrier are moved toward the N$^-$ type epitaxial layer 1b, and the holes generated in the N$^-$ type epitaxial layer 1b as a minority carrier are moved toward the P$^+$ type region 4. Therefore, a photoelectric current flows from the N$^-$ type epitaxial layer 1b to the P$^+$ type region 4, and intensity of the photoelectric current is proportional to intensity of the incident light. The photoelectric current is transmitted to the signal processing circuit 7 through the aluminum wires 20 and 21. Thereafter, the photoelectric current is amplified and converted into a digital signal in the signal processing circuit 7. The digital signal is output to an outside device through one of a plurality of pads 36 shown in FIG. 1.

Next, a manufacturing method for manufacturing the photo-sensor 44 shown in FIGS. 4 and 5 is described with reference to FIGS. 6 to 15.

Figure 6:
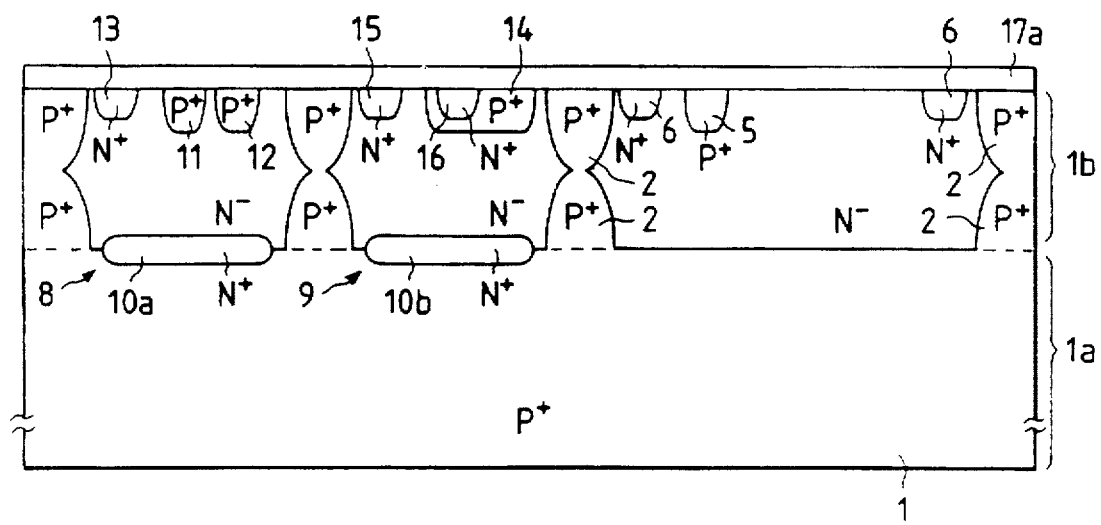
FIG. 6 is a cross sectional view of the photo-sensor in a manufacturing step of a manufacturing method according to the first embodiment.

As shown in FIG. 6, a device such as a transistor, a diffused resistor or the like is formed on the silicon substrate 1 formed in epitaxial growth according to a diffusion method used for a normal IC manufacturing. In detail, the N⁻ type epitaxial layer 1b is grown on the P⁺ type silicon substrate 1a. In this case, the N⁺ type buried layers 10a and 10b and the P⁺ type region 2 placed on the buried side are simultaneously formed. Thereafter, an ion injection and a thermal processing are performed for an upper surface of the N⁻ type epitaxial layer 1b epitaxially growing, the P⁺ type region 5, the N⁺ type region 6, the P⁺ type regions 11 and 12, the N⁺ type region 13, the P⁺ type region 14, the N⁺ type regions 15 and 16 and the P⁺ type region 2 for a device separation are formed in the N⁻ type epitaxial layer 1b.

Thereafter, the silicon oxide film (or a thermal oxide film) 17a is formed on the upper surface of the silicon substrate 1 according to a thermal oxidation processing.

Figure 7:
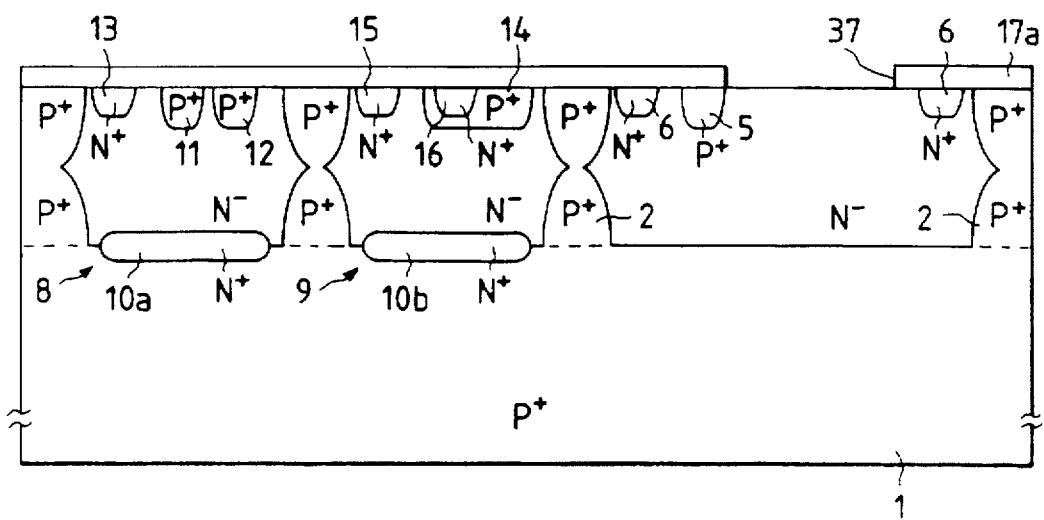
FIG. 7 is a cross sectional view of the photo-sensor in a manufacturing step of a manufacturing method according to the first embodiment.
Figure 8:
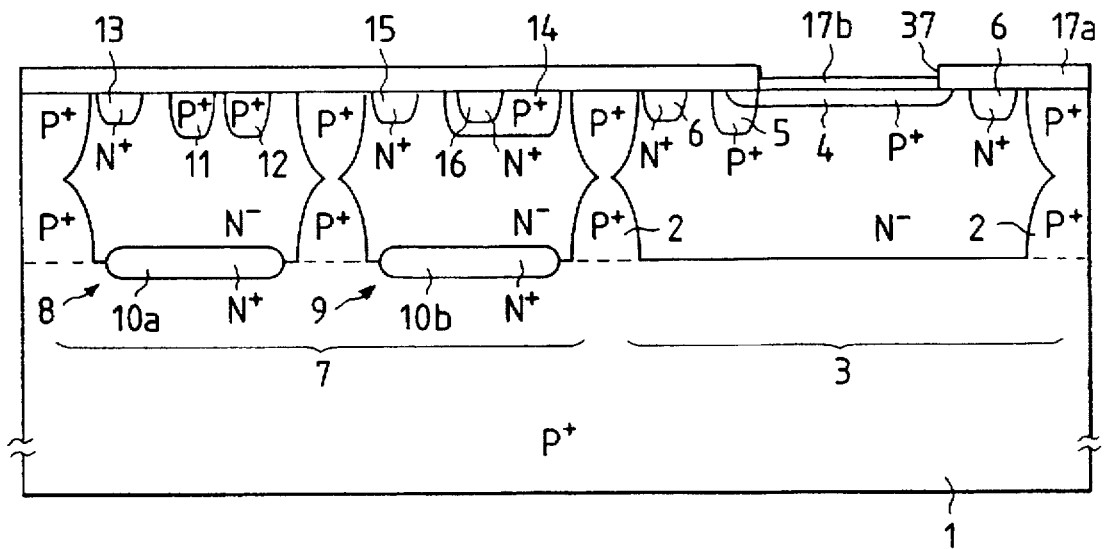
FIG. 8 is a cross sectional view of the photo-sensor in a manufacturing step of a manufacturing method according to the first embodiment.

Thereafter, as shown in FIG. 7, a portion of the silicon oxide film 17a planned to be used as a light receiving region is selectively removed according to a photo-etching, and an opening portion 37 is formed. Thereafter, as shown in FIG. 8, an upper surface portion of the silicon substrate 1 exposed to the opening portion 37 is thermally oxidized, and the silicon oxide film (or the thermal oxide film) 17b having a thickness of 1100 Å is formed in the opening portion 37 placed on the upper surface of the silicon substrate 1. The silicon oxide film 17b denotes a first insulating film. Thereafter, the P⁺ type region 4 is formed between the silicon oxide film 17b and the N⁻ type epitaxial layer 1b according to an ion implantation and a diffusing processing. Therefore, the photo diode device 3 and the signal processing circuit device 7 are formed in the silicon substrate 1, and the silicon oxide film 17b is formed in the light receiving region of the photo diode device 3.

Figure 9:
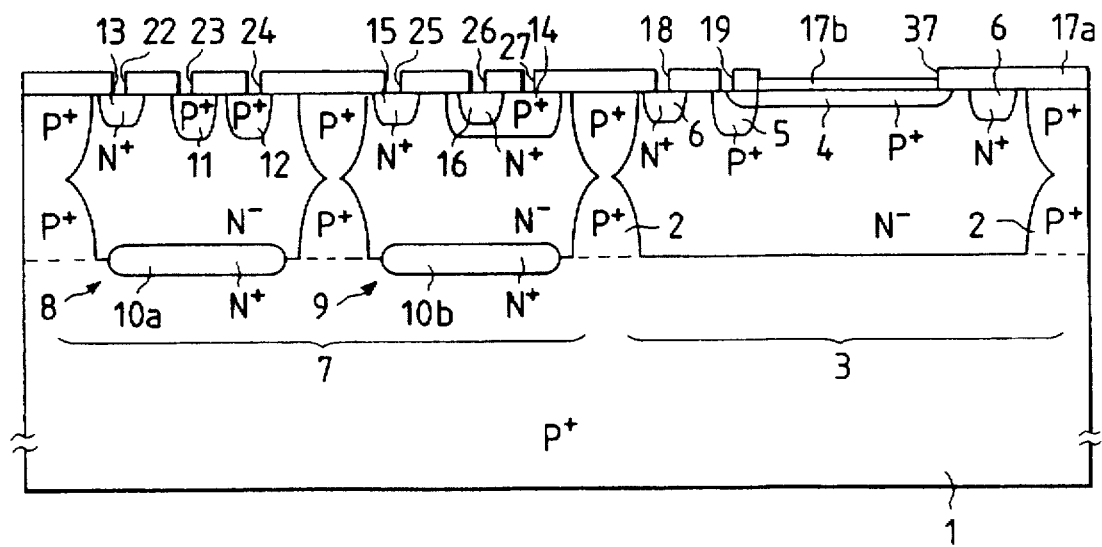
FIG. 9 is a cross sectional view of the photo-sensor in a manufacturing step of a manufacturing method according to the first embodiment; a manufacturing method according to the first embodiment.
Figure 10:
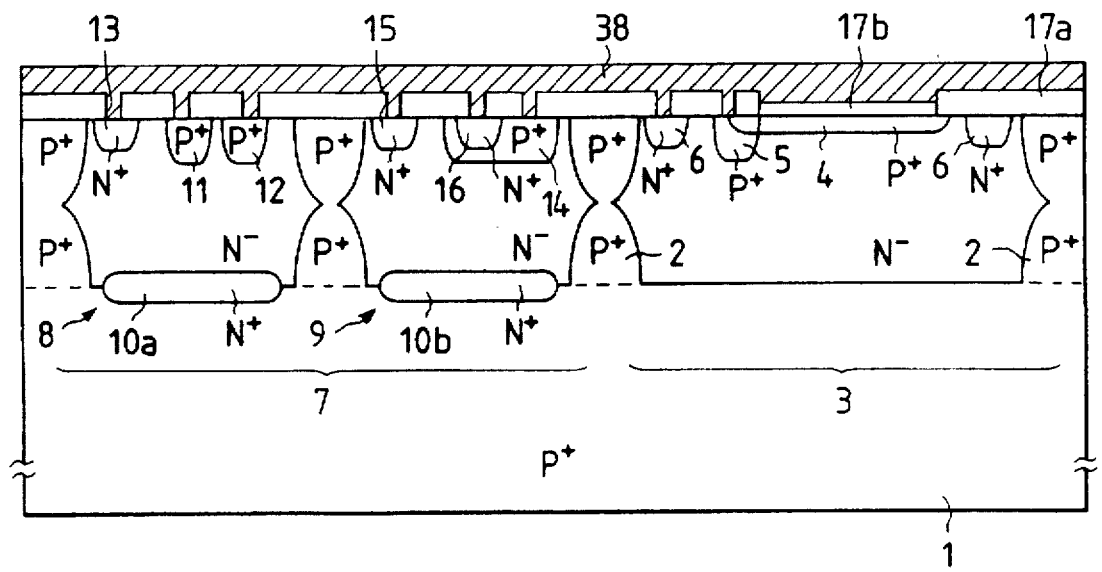
FIG. 10 is a cross sectional view of the photo-sensor in a manufacturing step of a manufacturing method according to the first embodiment.
Figure 11:
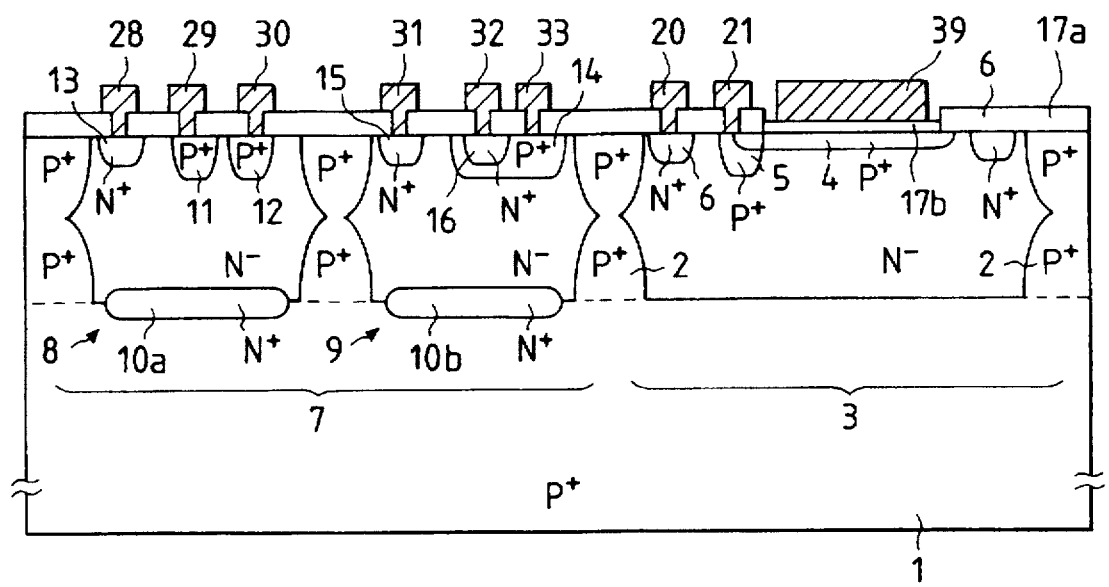
FIG. 11 is a cross sectional view of the photo-sensor in a manufacturing step of a manufacturing method according to the first embodiment.

Thereafter, as shown in FIG. 9, a plurality of prescribed regions 18, 19 and 22 to 27 of the silicon oxide film 17a are opened according to the etching processing. Thereafter, as shown in FIG. 10, an aluminum thin film 38 denoting a first metallic film is deposited and formed on the silicon oxide films 17a and 17b. Thereafter, as shown in FIG. 11, the aluminum thin film 38 is patterned according to a photo-etching (for example, a wet etching using an etchant of a phosphoric acid), and the aluminum wires 20, 21 and 28 to 33 and the pads 36 are formed. In this case, a portion of the aluminum thin film 38 placed on the light receiving region of the photo diode device 3 is not etched and remains. The portion of the aluminum thin film 38 is identified by a symbol 39, and the aluminum thin film 39 is used as a protective film.

Figure 12:
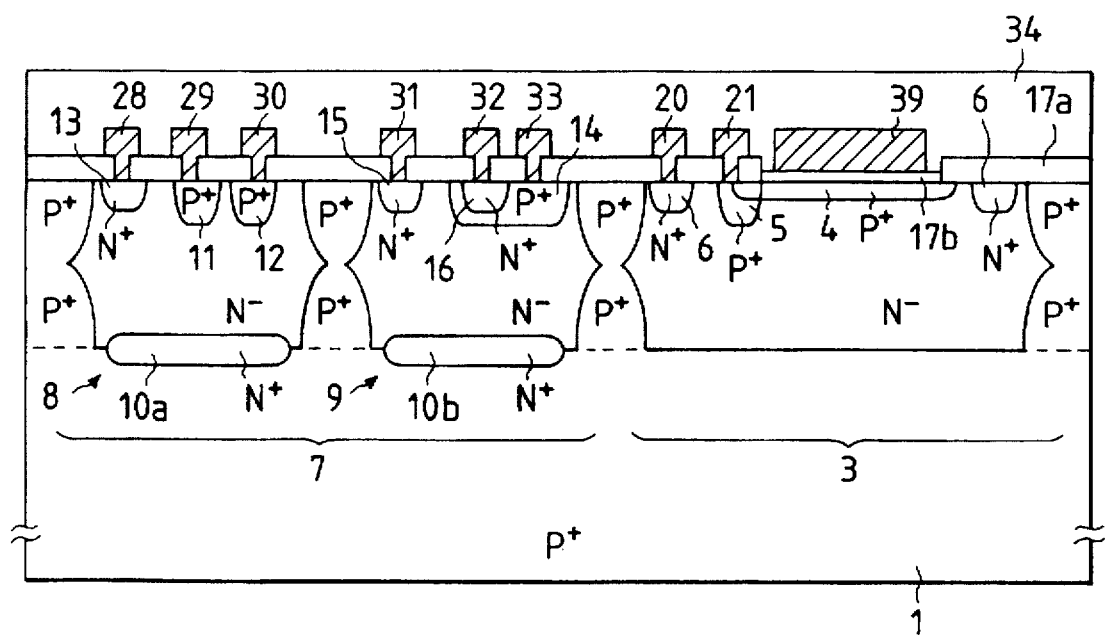
FIG. 12 is a cross sectional view of the photo-sensor in a manufacturing step of a manufacturing method according to the first embodiment; a manufacturing method according to the first embodiment.
Figure 13:
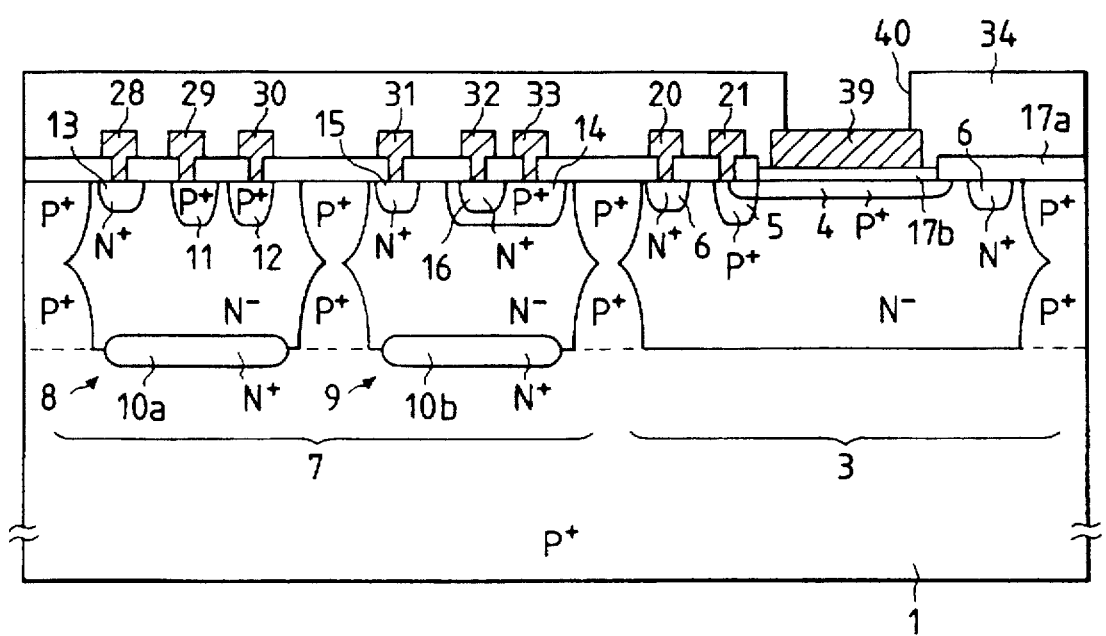
FIG. 13 is a cross sectional view of the photo-sensor in a manufacturing step of a manufacturing method according to the first embodiment.

Thereafter, as shown in FIG. 12, the inter-layer insulating film 34 is deposited and formed on the silicon oxide film 17a, the aluminum wires 20, 21 and 28 to 33 and the aluminum thin film 39. In detail, a silicon oxide film having a thickness of 400 nm and a silicon nitride film having a thickness of 500 nm are formed as the inter-layer insulating film 34 according to a CVD method. Thereafter, as shown in FIG. 13, a portion of the inter-layer insulating film 34 (composed of the silicon nitride film and the silicon oxide film) placed in the light receiving region of the photo diode device 3 is removed according to a photo-etching, and an opening portion 40 is formed. In this case, the silicon nitride film of the inter layer insulating film 34 is removed according to a dry etching using $CF_4$ gas, and the silicon oxide film is removed according to a wet etching using an etchant of HF.

Figure 14:
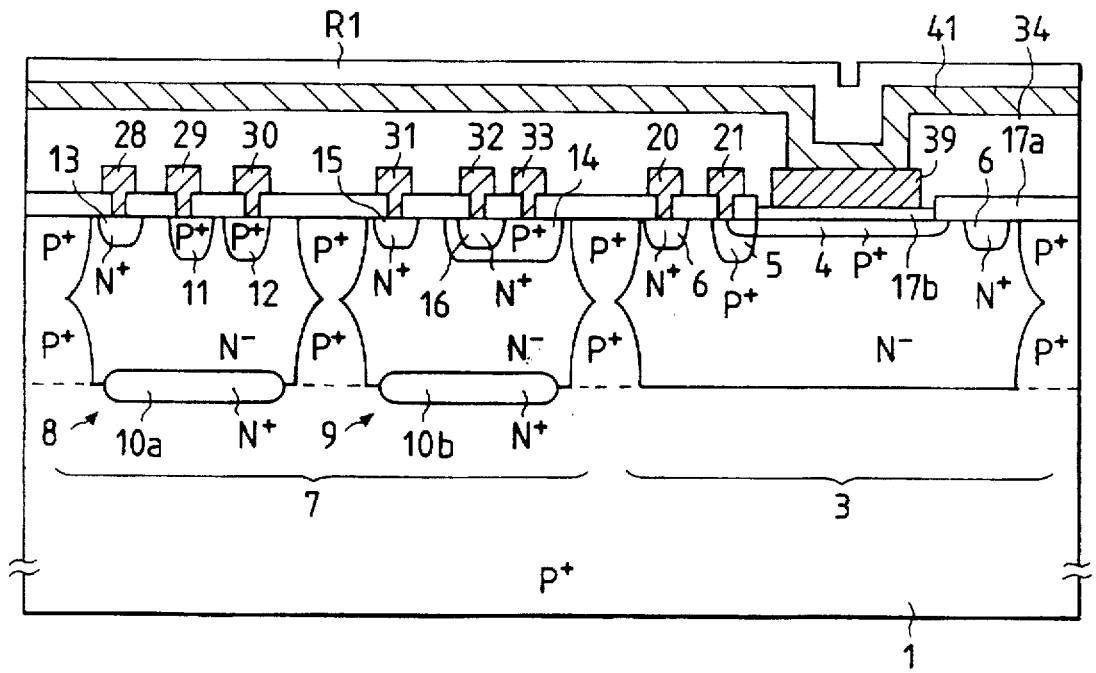
FIG. 14 is a cross sectional view of the photo-sensor in a manufacturing step of a manufacturing method according to the first embodiment.
Figure 15:
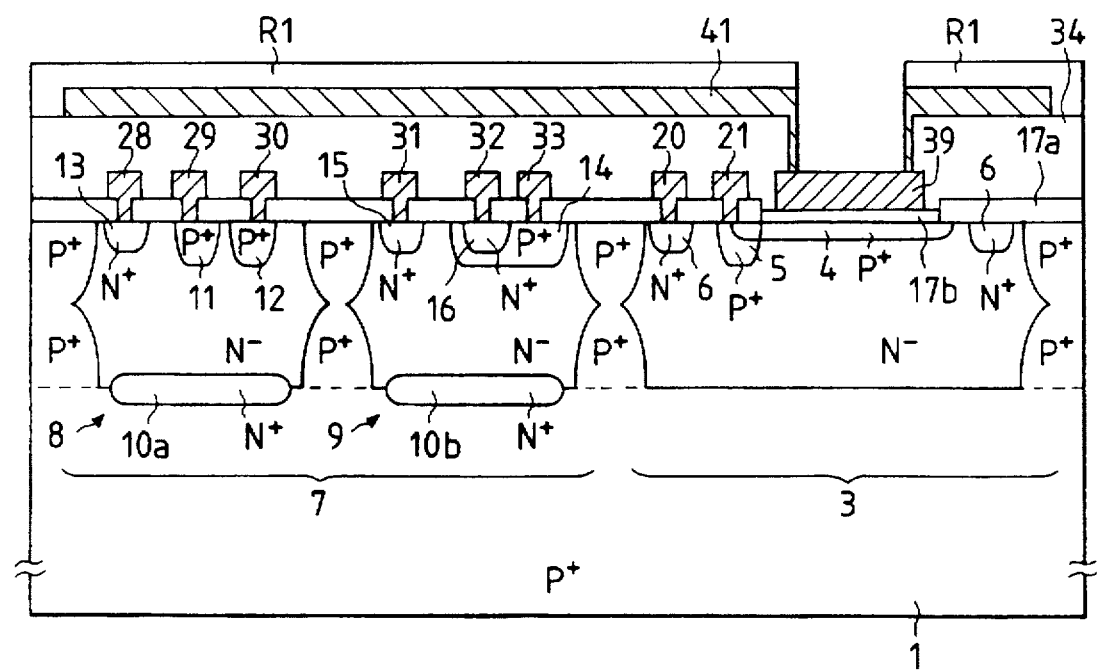
FIG. 15 is a cross sectional view of the photo-sensor in a manufacturing step of a manufacturing method according to the first embodiment; a manufacturing method according to the first embodiment.

Thereafter, as shown in FIG. 14, the aluminum thin film 35 functioning as a shielding film is deposited and formed on the inter-layer insulating film 34 and the aluminum thin film 39. The aluminum thin film 35 denotes a second metallic film. Thereafter, as shown in FIG. 15, a portion of the aluminum thin film 35 placed on the light receiving region of the photo diode device 3 is etched and removed by using a phosphoric acid solution as an etchant, and the other portion of the aluminum thin film 35 placed on the signal processing circuit device 7 remains as the shielding film. In this case, an etching-resistance film R1 is formed on the aluminum thin film 35 to prevent the pads 36 from being etched when the portion of the aluminum thin film 35 is etched. For example, the etching-resistance film R1 is made of a photoresist. Thereafter, as shown in FIG. 5, a central portion of the aluminum thin film 39 placed on the light receiving region of the photo diode device 3 is etched and removed by using the phosphoric acid solution as an etchant. In this case, the a etching-resistance film R1 prevents the pads 36 from being etched. Also, the remaining portion of the aluminum thin film 39 is connected with the aluminum thin film 35 to prevent the inter-layer insulating film 34 from being exposed to the opening portion 40 of the light receiving region. Thereafter, the etching-resistance film R1 is removed, and the photo-sensor 44 is manufactured.

Therefore, all films placed on the silicon oxide film 17b which is placed on the P⁺ type region 4 functioning as the light receiving element of the photo diode device 3 are etched and removed.

Accordingly, the first embodiment has following features.

(1) In the conventional method, because the inter-layer insulating film 73 is arranged on a light-receiving element of a photoelectric transfer device (or a photo-transistor), an insulating film arranged on the light-receiving element is undesirably thickened. However, in this embodiment, because the inter-layer insulating film 34 placed on the light receiving region of the photo diode device 3 is removed and only the silicon oxide film 17b is placed on the P⁺ type region 4 as an insulating film, there is no probability that the insulating film placed on the P⁺ type region 4 functioning as the light receiving element of the photo diode device 3 (or a photoelectric transfer device) is thickened. That is, the insulating film placed on the light receiving element can be thinned, and a light receiving sensitivity of the photo diode device 3 functioning as the photoelectric transfer device can be improved.

(2) The silicon oxide film 17b is arranged on the P⁺ type region 4 functioning as the light receiving element of the photo diode device 3 before the aluminum thin film 38 shown in FIG. 10 is arranged on the light receiving region, and only the silicon oxide film 17b remains on the P⁺ type region 4. Therefore, when the inter-layer insulating film 34 is etched, the aluminum thin film 39 prevents that the silicon oxide film 17b is undesirably etched, so that an unevenness of a plurality of film thicknesses of the insulating films (or the silicon oxide films 17b) respectively covering the light receiving element of the photo diode device 3 can be suppressed. That is, the silicon oxide film 17b covering the light receiving element (or the P⁺ type region 4) of the photo diode device 3 can be correctly formed at a desired film thickness, and a light receiving characteristic of the photo diode device 3 (or the photoelectric transfer device) can be improved.

(3) As shown in FIG. 13, when the opening portion 40 is formed, the inter-layer insulating film 34 is etched on condition that the silicon oxide film 17b is protected by the aluminum thin film 39 arranged on the silicon oxide film 17b. Therefore, the silicon oxide film 17b is not damaged in the etching operation.

Figure 1:
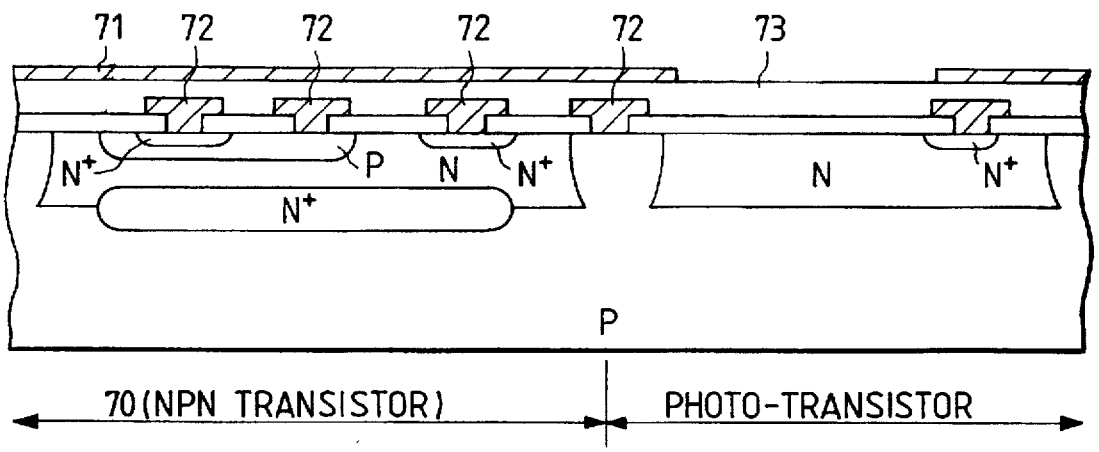
FIG. 1 is a cross sectional view of a conventional photo-sensor.
Figure 2:
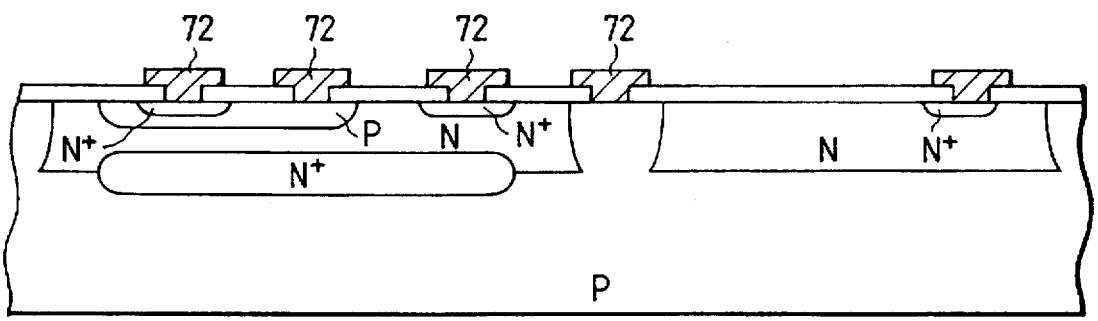
FIG. 2 is a cross sectional view of the conventional photo-sensor in a manufacturing step of a conventional method for manufacturing the conventional photo-sensor.
Figure 3:
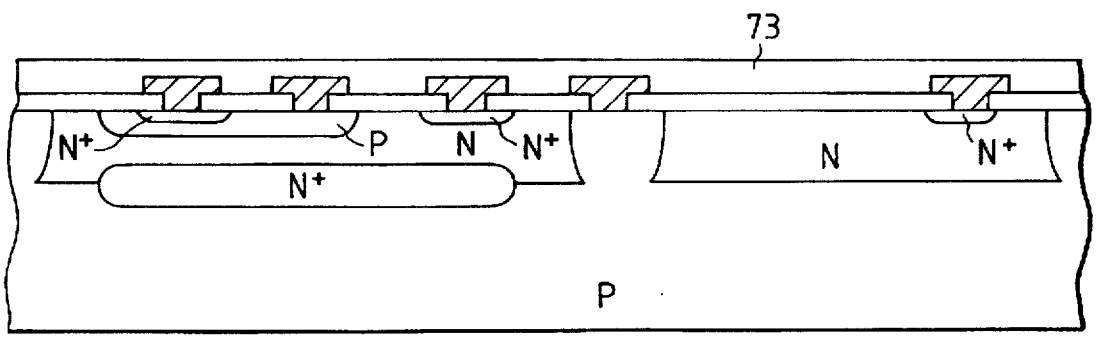
FIG. 3 is a cross sectional view of the conventional photo-sensor in another manufacturing step of the conventional method for manufacturing the conventional photo-sensor.

(4) In the conventional photo-sensor shown in FIG. 1, assuming that the inter-layer insulating film 73 is etched to thin the inter-layer insulating film 73 arranged on a light-receiving element of a photoelectric transfer device (or a photo-transistor), the etching operation is finished in cases where it is assumed that the inter-layer insulating film 73 be thinned to a prescribed film thickness because the etching operation is performed for a predetermined time. However, it is difficult to stably set a film thickness of the inter-layer insulating film 73 etched in the etching operation. In contrast, in this embodiment, because the aluminum thin film 39 made of the material different from that of the silicon oxide film 17b is arranged on the silicon oxide film 17b, as shown in FIG. 5, the aluminum thin film 39 can be selectively etched without adversely influencing on the silicon oxide film 17b. Therefore, only the silicon oxide film 17b can remain on the P$^+$ type region 4 functioning as the light receiving element of the photo diode device 3, and a film thickness of the silicon oxide film 17b can be easily set to a desired value.

(5) When the inter-layer insulating film 34 is etched and removed to form the opening portion 40, the aluminum thin film 39 functions as an etching-resistance film to prevent the silicon oxide film 17b from being etched with the inter-layer insulating film 34. Therefore, the inter-layer insulating film 34 made of a material having the same etching property as the material of the silicon oxide film 17b can be used. In other words, the material of the inter-layer insulating film 34 having no etching selection ratio for the material of the silicon oxide film 17b can be used. A silicon oxide film, a BPSG (boro-phospho-silicate glass) film, a PSG (phospho-silicate glass) film or the like generally used as a material of an inter-layer insulating film can be used as the material of the inter-layer insulating film 34.

(6) The aluminum thin film 35 and the aluminum thin film 39 can be successively removed as shown in FIGS. 14, 15 and 5.

(7) The silicon oxide film 17b is formed according to the thermal oxidation processing as a first insulating film. Therefore, a thermal oxide film denoting the silicon oxide film 17b is arranged on the light receiving element (the P$^+$ type region 4) of the photo diode device 3, and the silicon oxide film 17b can be correctly formed at a desired film thickness as compared with that in an insulating film formed according to a CVD method.

(8) A material of the aluminum thin film 38 denoting the first metallic film is the same as that of the aluminum thin film 35 denoting the second metallic film. Therefore, the etching operation for the aluminum thin film 35 can be performed by using the same etchant as that used in the etching operation for the aluminum thin film 38. In other words, the aluminum thin film 35 can be etched according to the same etching operation as that for the aluminum thin film 38. Therefore, the etching operation for the aluminum thin films 38 and 35 can be easily performed.

(9) Because the aluminum thin film 38 denoting the first metallic film and the aluminum thin film 35 denoting the second metallic film are made of aluminum, the etching operation for the aluminum thin films 38 and 35 can be easily performed.

(10) The aluminum thin film 39 denoting the first metallic film and the aluminum thin film 35 denoting the second metallic film are connected with each other in the photo diode device 3 to surround the opening portion 40. Therefore, the inter-layer insulating film 34 is not exposed to the opening portion 40 of the light receiving region. Because of this configuration of the aluminum thin film 39, the aluminum thin film 35 and the inter-layer insulating film 34, there is no probability that light passes through a space between the aluminum thin film 39 and the aluminum thin film 35 and reaches the signal processing circuit device 7. In detail, light such as sunlight is not necessarily incident on the light receiving element (the P$^+$ type region 4) of the photo diode device 3 perpendicularly to the P$^+$ type region 4, and the light is obliquely incident on the P$^+$ type region 4. In this case, assuming that the inter-layer insulating film 34 is exposed to the opening portion 40 through a space between the aluminum thin film 39 and the aluminum thin film 35, the light reaches the signal processing circuit device 7 through the inter-layer insulating film 34, and a malfunction of the signal processing circuit device 7 occurs because a photoelectric current is generated from the light in the signal processing circuit device 7. However, in this embodiment, because the inter-layer insulating film 34 is not exposed to the opening portion 40 of the light receiving region, any malfunction of the signal processing circuit device 7 caused by the light can be prevented.

(Second Embodiment)

A manufacturing method for manufacturing a photo-sensor according to a second embodiment is described with reference to FIGS. 16 to 19.

Figure 16:
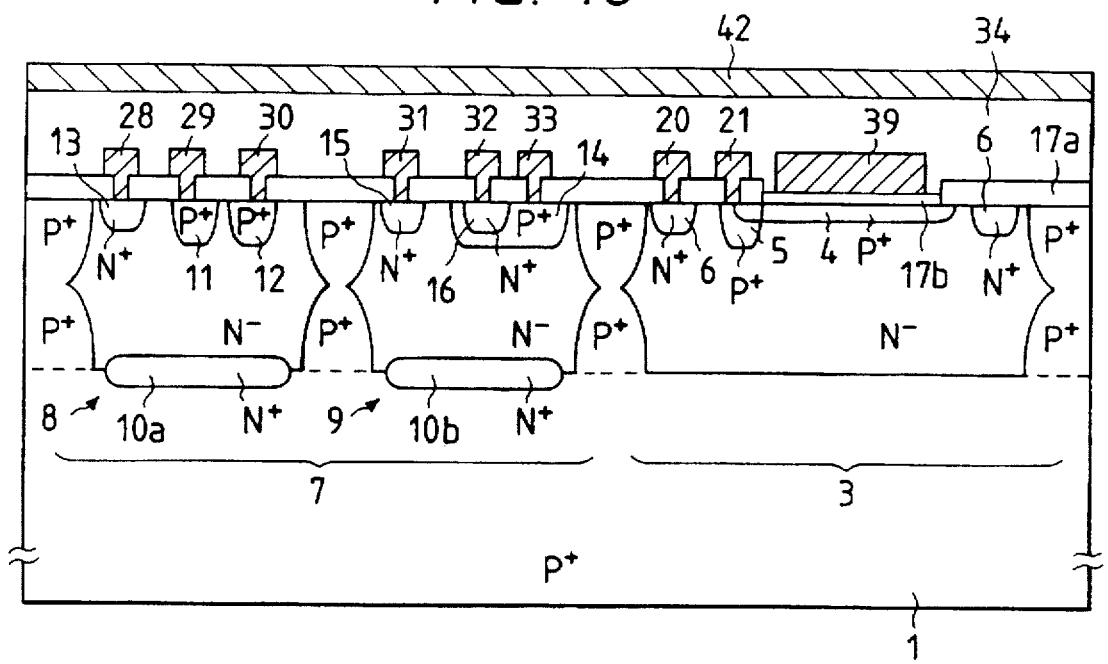
FIG. 16 is a cross sectional view of a photo-sensor in a manufacturing step of a manufacturing method according to a second embodiment.
Figure 17:
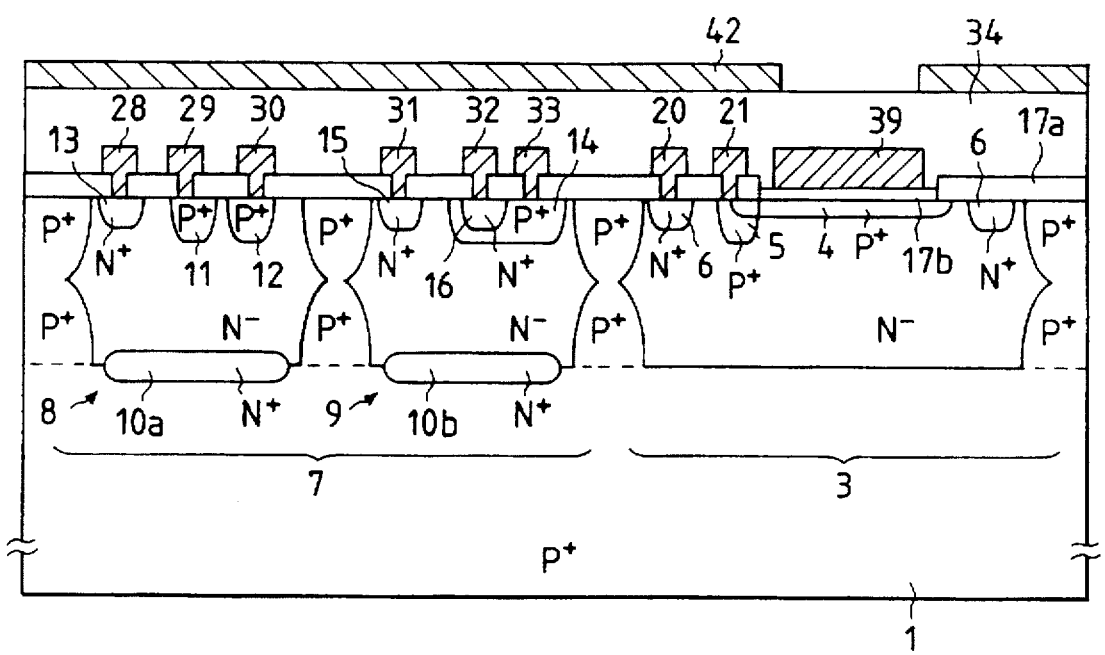
FIG. 17 is a cross sectional view of the photo-sensor in a manufacturing step of the manufacturing method according to the second embodiment.

In the second embodiment, a plurality of manufacturing steps shown in FIGS. 6 to 12 are performed in the same manner as in the first embodiment. Thereafter, as shown in FIG. 16, an aluminum thin film 42 denoting a second metallic film is deposited and formed on the inter-layer insulating film 34. Thereafter, as shown in FIG. 17, the aluminum thin film 42 is pattern-etched to remove a portion of the aluminum thin film 42 placed on the light receiving element (the P$^+$ type region 4) of the photo diode device 3. In this case, the other portion of the aluminum thin film 42 remains on the signal processing circuit device 7 as a shielding film.

Figure 18:
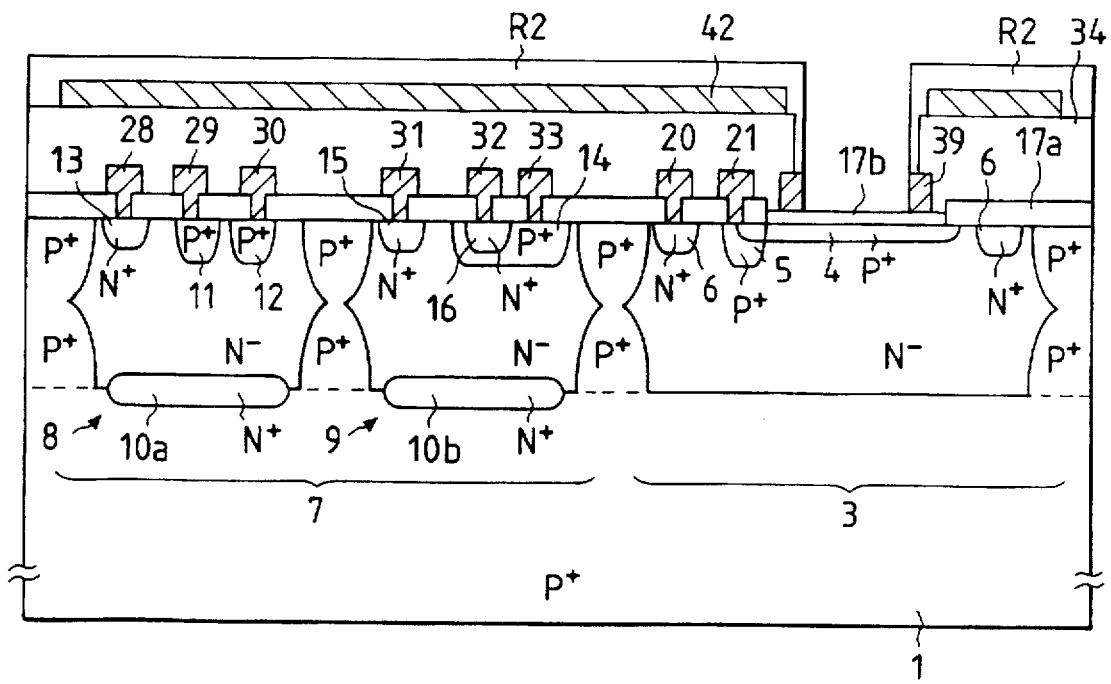
FIG. 18 is a cross sectional view of the photo-sensor in a manufacturing step of the manufacturing method according to the second embodiment.
Figure 19:
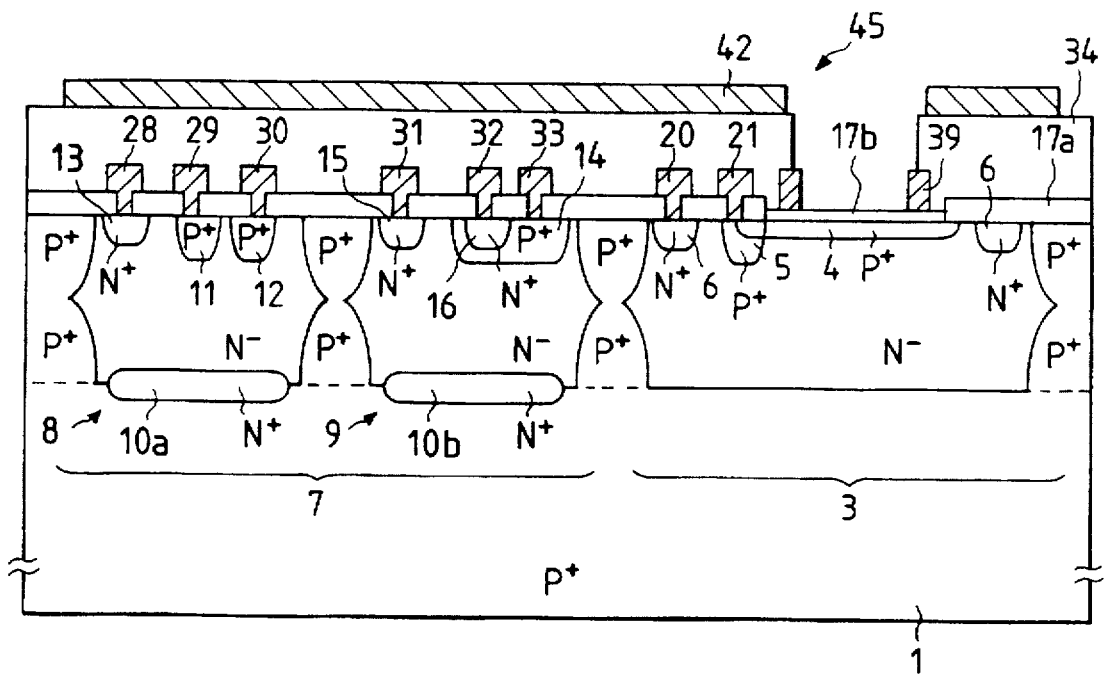
FIG. 19 is a cross sectional view of a photo-sensor manufactured according to the second embodiment.

Thereafter, as shown in FIG. 18, a portion of the inter-layer insulating film 34 and a central portion of the aluminum thin film 39 placed on the light receiving element of the photo diode device 3 are etched and removed in that order. In this case, an etching-resistance film R2 made of a photoresist is formed on the aluminum thin film 42 after the portion of the inter-layer insulating film 34 is etched. Therefore, when the central portion of the aluminum thin film 39 are etched, the etching-resistance film R2 prevents the pads 36 and the aluminum thin film 42 from being etched. Thereafter, as shown in FIG. 19, the etching-resistance film R2 is removed, and a photo-sensor 45 according to the second embodiment is manufactured.

Accordingly, the second embodiment has following features.

(1) In the first embodiment, portions of the aluminum thin films 35 and 39 are successively etched in that order. In this case, when the aluminum thin film 39 is etched after the aluminum thin film 35 is etched, a side etching of the aluminum thin film 35 is continued. Therefore, there is a drawback that the aluminum thin film 35 is excessively side-etched and a prescribed pattern of the aluminum thin film 35 functioning as a shielding film is not accurately obtained. In contrast, in the second embodiment, because the aluminum thin films 42 and 39 are not successively etched and the etching of the aluminum thin film 39 and the etching of the aluminum thin film 42 are separately performed, the aluminum thin film 42 is protected by the etching-resistance film R2 when the aluminum thin film 39 is etched. Therefore, there is no probability that the aluminum thin film 42 is excessively side-etched, and the aluminum thin film 42 can be correctly formed in a designed shielding film pattern.

(2) In this embodiment, because the inter-layer insulating film 34 placed on the light receiving element of the photo diode device 3 is removed and only the silicon oxide film 17b is placed on the P$^+$ type region 4 as an insulating film, there is no probability that the insulating film placed on the P$^+$ type region 4 functioning as the light receiving element of the photo diode device 3 (or a photoelectric transfer device) is thickened. That is, the insulating film placed on the light receiving element can be thinned, and a light receiving sensitivity of the photo diode device 3 functioning as the photoelectric transfer device can be improved.

(3) As shown in FIG. 17, the inter-layer insulating film 34 is etched on condition that the silicon oxide film 17b is protected by the aluminum thin film 39 arranged on the silicon oxide film 17b. Therefore, the silicon oxide film 17b is not damaged in the etching operation.

(4) In this embodiment, because the aluminum thin film 39 made of the material different from that of the silicon oxide film 17b is arranged on the silicon oxide film 17b, as shown in FIG. 18, the aluminum thin film 39 can be selectively etched without etching the silicon oxide film 17b. Therefore, only the silicon oxide film 17b can remain on the P$^+$ type region 4 functioning as the light receiving element of the photo diode device 3, and a film thickness of the silicon oxide film 17b can be easily set to a desired value.

(Third Embodiment)

A configuration of a photo-sensor manufactured according to a third embodiment is described with reference to FIGS. 20 and 21.

Figure 20:
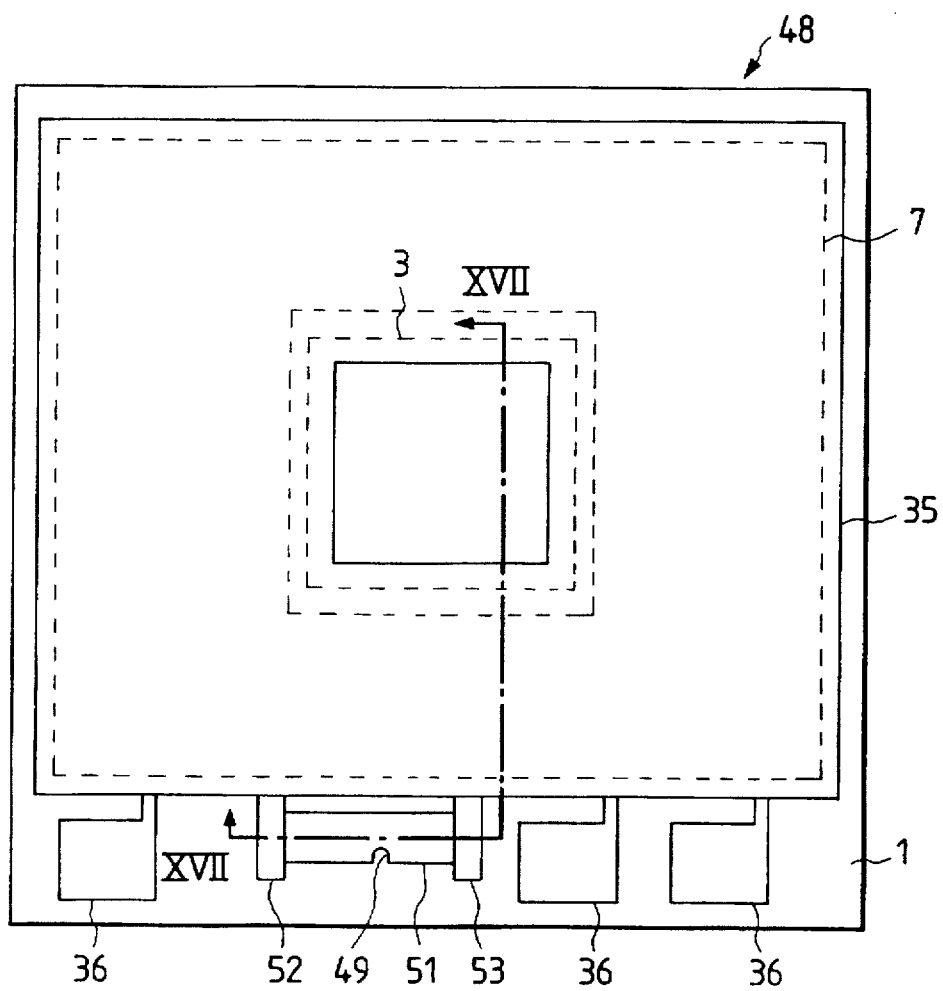
FIG. 20 is a plan view of a photo-sensor manufactured according to a third embodiment.
Figure 21:
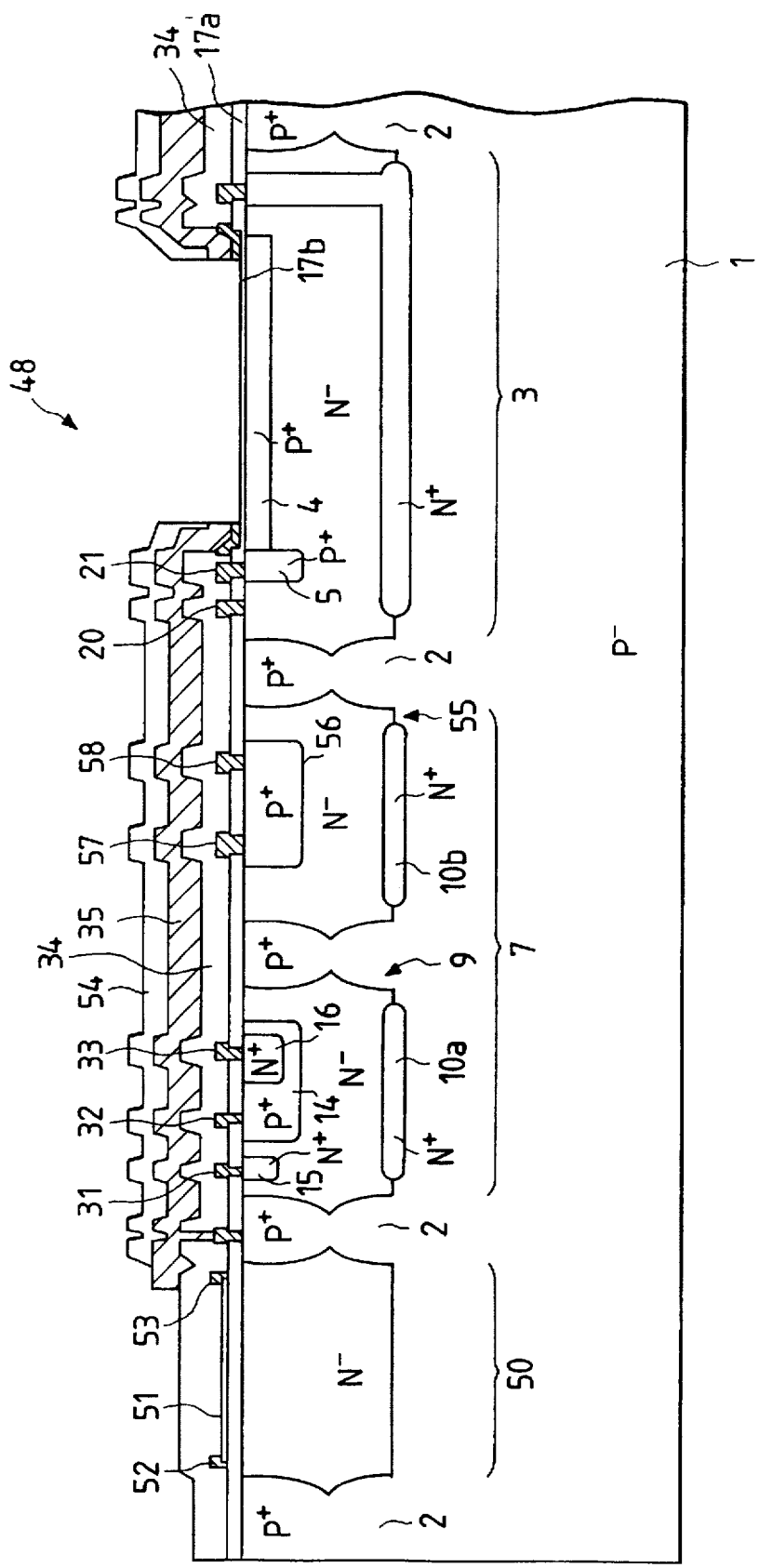
FIG. 21 is a cross sectional view taken generally along a line XVII—XVII line of FIG. 20.

FIG. 20 is a plan view of a photo-sensor manufactured according to a third embodiment, and FIG. 21 is a cross sectional view taken generally along a line XVII—XVII line of FIG. 20.

As shown in FIGS. 20 and 21, the photo diode device 3, the signal processing circuit device 7 and a laser trim adjusting resistive element device 50 are arranged in a photo-sensor 48. In the laser trim adjusting resistive element device 50, a laser trim adjusting thin-film resistive element 51 made of CrSi or CrSiN is arranged on the silicon oxide film 17a, an aluminum wire 52 is connected with one end of the laser trim adjusting thin-film resistive element 51, and an aluminum wire 53 is connected with the other end of the laser trim adjusting thin-film resistive element 51. The laser trim adjusting thin-film resistive element 51 is formed in a rectangular shape, and a concave portion 49 is formed in the laser trim adjusting thin-film resistive element 51 by performing a laser trimming for a portion of the laser trim adjusting thin-film resistive element 51. The laser trim adjusting resistive element device 50 is isolated by the P$^+$ type region 2.

Also, the inter-layer insulating film 34 is arranged on the laser trim adjusting thin-film resistive element 51. However, the aluminum thin film 35 arranged on the inter-layer insulating film 34 in a region of the signal processing circuit device 7 is not arranged on the inter-layer insulating film 34 in a region of the laser trim adjusting resistive element device 50. Also, though a surface protective film 54 denoting a third insulating film is arranged on the aluminum thin film 35 in the region of the signal processing circuit device 7, any third insulating film is not arranged in the region of the laser trim adjusting resistive element device 50.

Also, the NPN bipolar transistor 9 and a diffused resistor 55 are arranged in the signal processing circuit device 7, and a pair of aluminum wires 57 and 58 are respectively connected with a P$^+$ type region 56 of the diffused resistor 55.

Next, a manufacturing method for manufacturing the photo-sensor 48 having the above configuration is described with reference to FIGS. 22 to 28.

Figure 22:
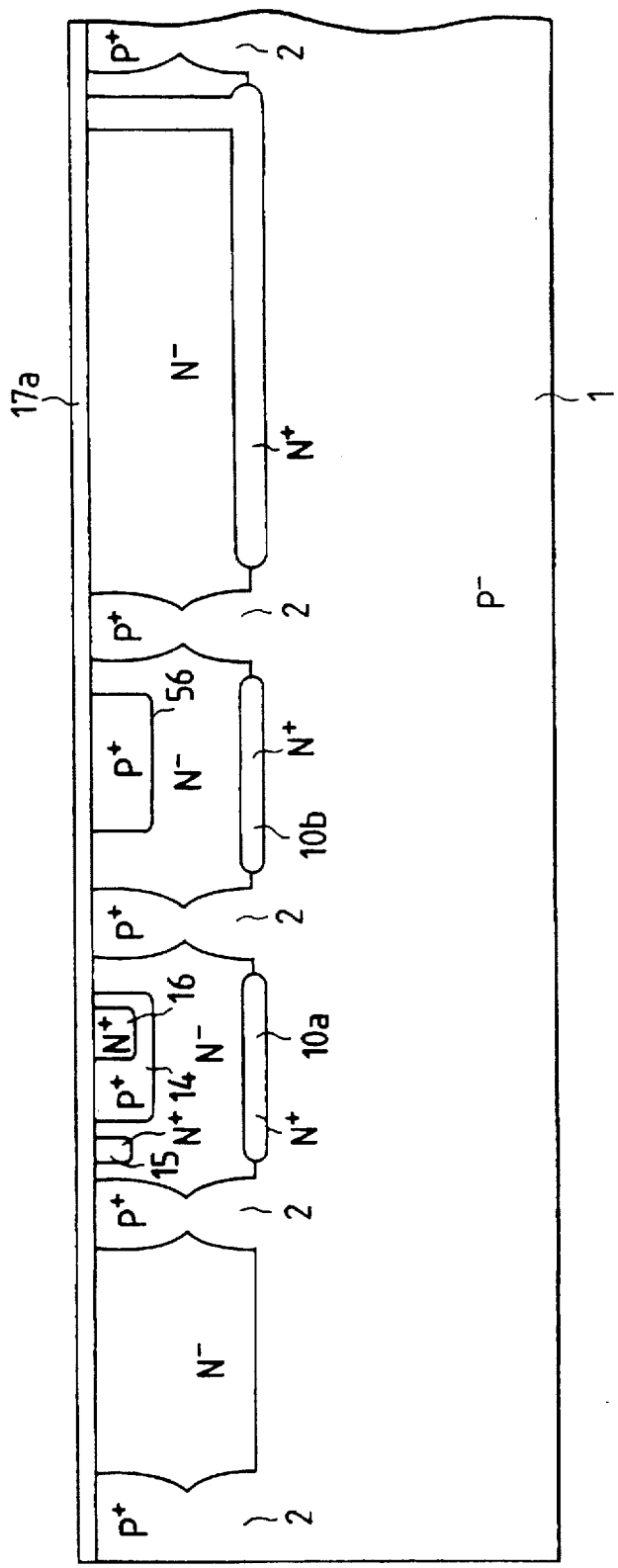
FIG. 22 is a cross sectional view of the photo-sensor in a manufacturing step of a manufacturing method according to the third embodiment.
Figure 23:
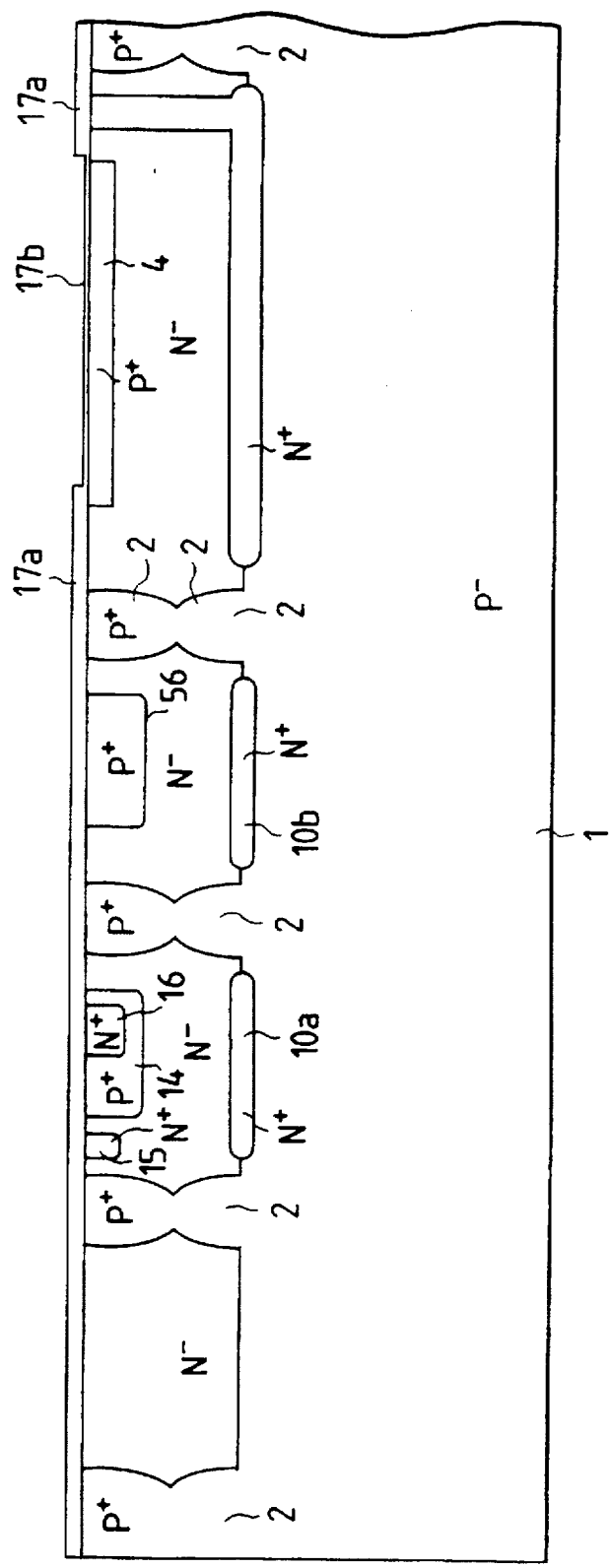
FIG. 23 is a cross sectional view of the photo-sensor in a manufacturing step of the manufacturing method according to the third embodiment.
Figure 24:
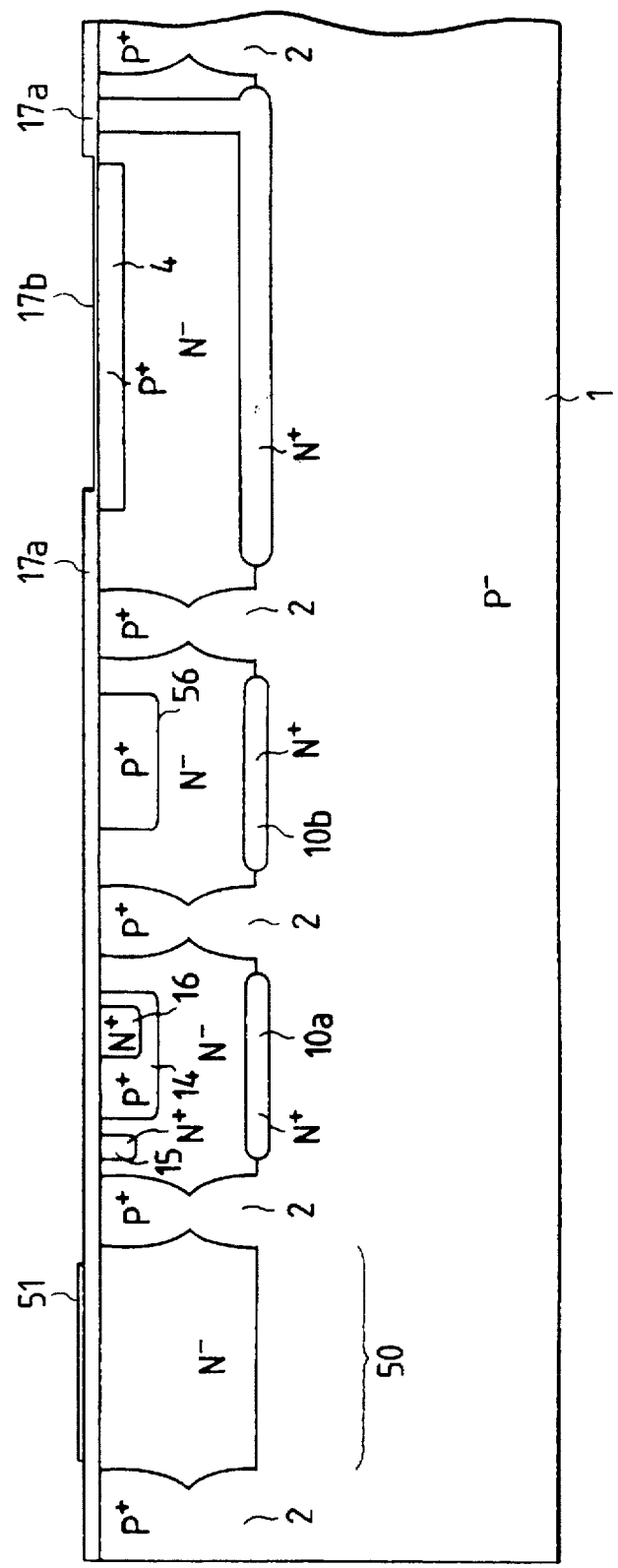
FIG. 24 is a cross sectional view of the photo-sensor in a manufacturing step of the manufacturing method according to the third embodiment.

As shown in FIG. 22, the regions 14, 15, 16 and 56 functioning as a transistor or a diffused resistor are formed in the upper portion of the silicon substrate 1 according to a diffusing processing generally used in the integrated circuit (IC) manufacturing, and the silicon oxide film 17a is formed on the silicon substrate 1. Thereafter, as shown in FIG. 23, a portion of the silicon oxide film 17a placed in a region planned as a light receiving region of a photoelectric transfer device is selectively etched according to a photo-etching, and a thermal oxide film 17b having a thickness of 1100 Å is formed in the light receiving region. Thereafter, the P$^+$ type region 4 functioning as a light receiving element of the photo diode device 3 (or the photoelectric transfer device) is formed under the thermal oxide film 17b according to an ion implantation and diffusing processing. Thereafter, a Cr—Si thin film is formed on the silicon oxide film 17a according to a sputtering method and is photo-etched to make the Cr—Si thin film in a prescribed shape. Therefore, as shown in FIG. 24, the laser trim adjusting thin-film resistive element 51 is formed by patterning the Cr—Si thin film. In this case, a dry etching is performed to photo-etch the Cr—Si thin film.

Figure 25:
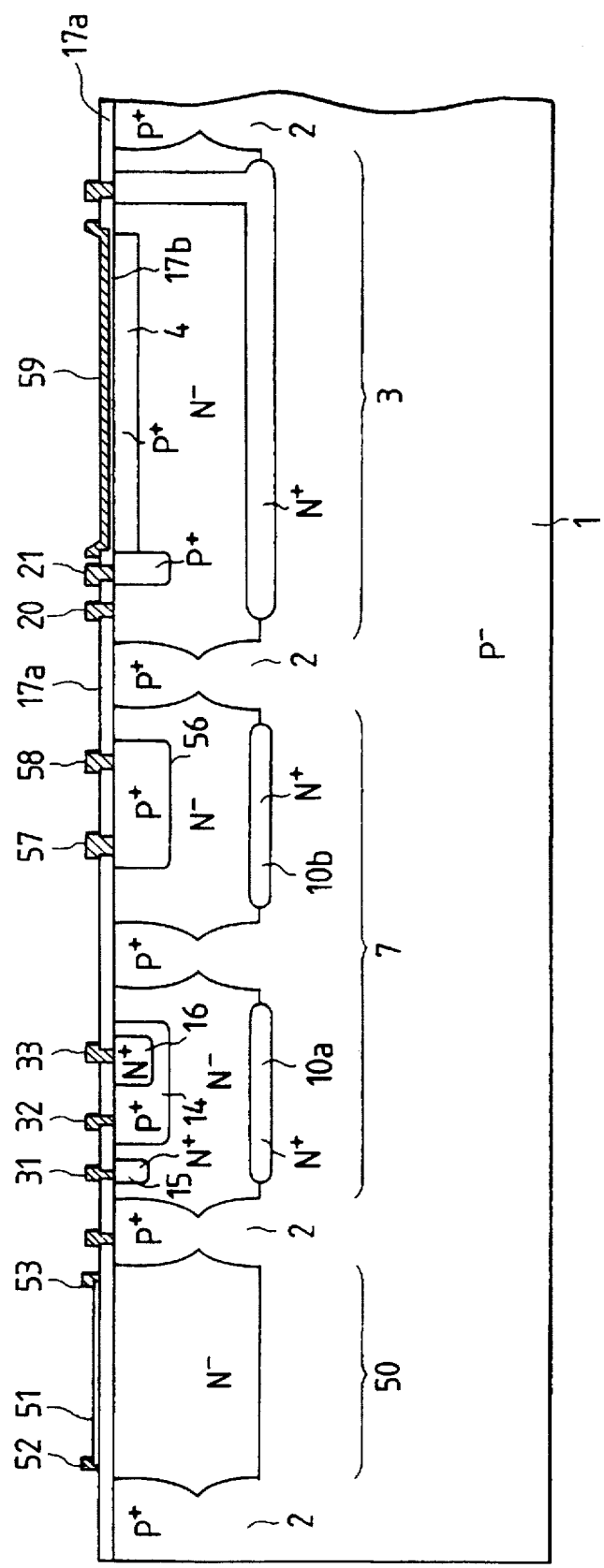
FIG. 25 is a cross sectional view of the photo-sensor in a manufacturing step of the manufacturing method according to the third embodiment.
Figure 26:
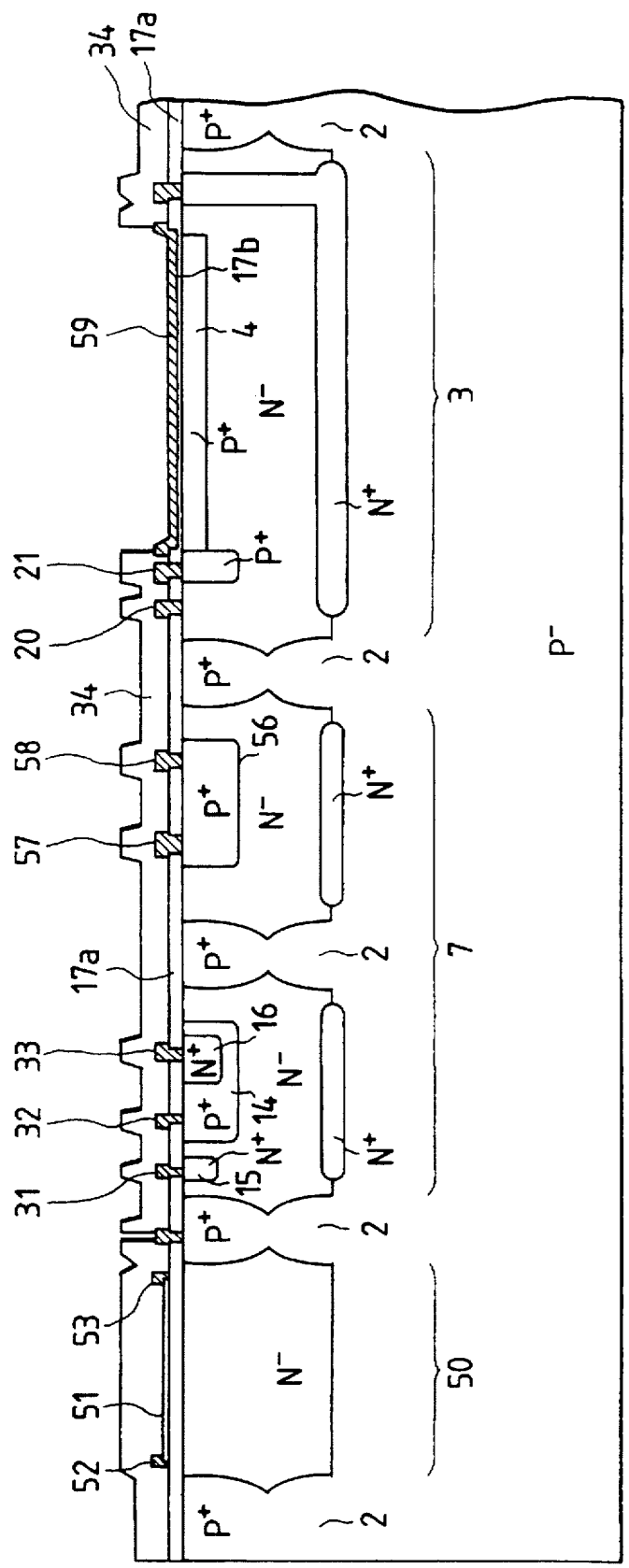
FIG. 26 is a cross sectional view of the photo-sensor in a manufacturing step of the manufacturing method according to the third embodiment.

Thereafter, as shown in FIG. 25, an aluminum thin film denoting a first metallic film is formed on the silicon oxide film 17a, the thermal oxide film 17b and the laser trim adjusting thin-film resistive element 51 at a thickness of 1.1 μm, and the aluminum wires 52, 53, 31, 32, 33, 57 and 58 are formed by photo-etching the aluminum thin film in a prescribed shape. In this case, a portion of the aluminum thin film placed on the thermal oxide film 17b remains as an aluminum thin film 59. Thereafter, as shown in FIG. 26, the inter-layer insulating film 34 composed of the silicon oxide film having a thickness of 400 nm and the silicon nitride film having a thickness of 500 nm is formed on the aluminum wires 52, 53, 31, 32, 33, 57 and 58, the aluminum thin film 59, the laser trim adjusting thin-film resistive element 51 and the silicon oxide film 17a according to a CVD method, and a portion of the inter-layer insulating film 34 placed on the aluminum thin film 59 is removed.

Figure 27:
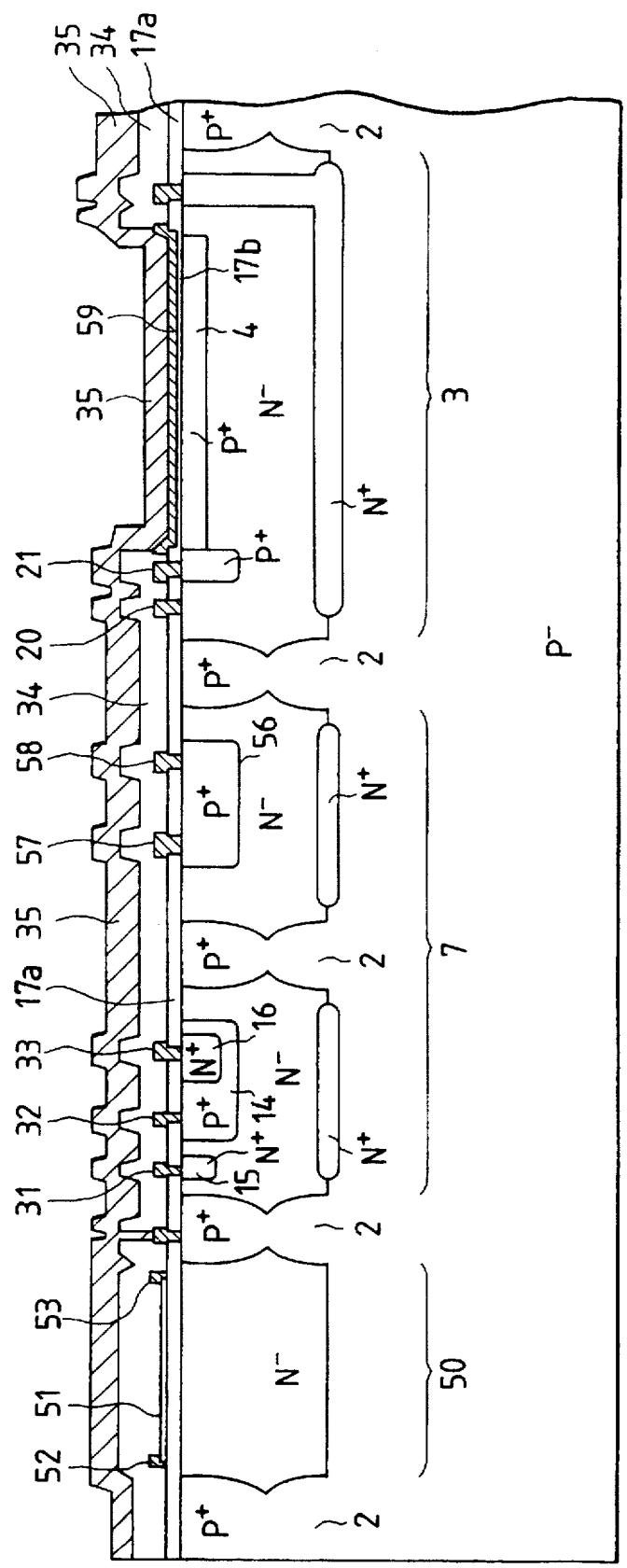
FIG. 27 is a cross sectional view of the photo-sensor in a manufacturing step of the manufacturing method according to the third embodiment.

Thereafter, as shown in FIG. 27, the aluminum thin film 35 denoting a second metallic film is formed on the inter-layer insulating film 34 and the aluminum thin film 59. The aluminum thin film 35 has a thickness of 1.1 μm and functions as a shielding film. Thereafter, the aluminum thin film 35 is photo-etched and patterned in a shielding pattern on condition that a portion of the aluminum thin film 35 placed on the laser trim adjusting thin-film resistive element 51 remains.

Figure 28:
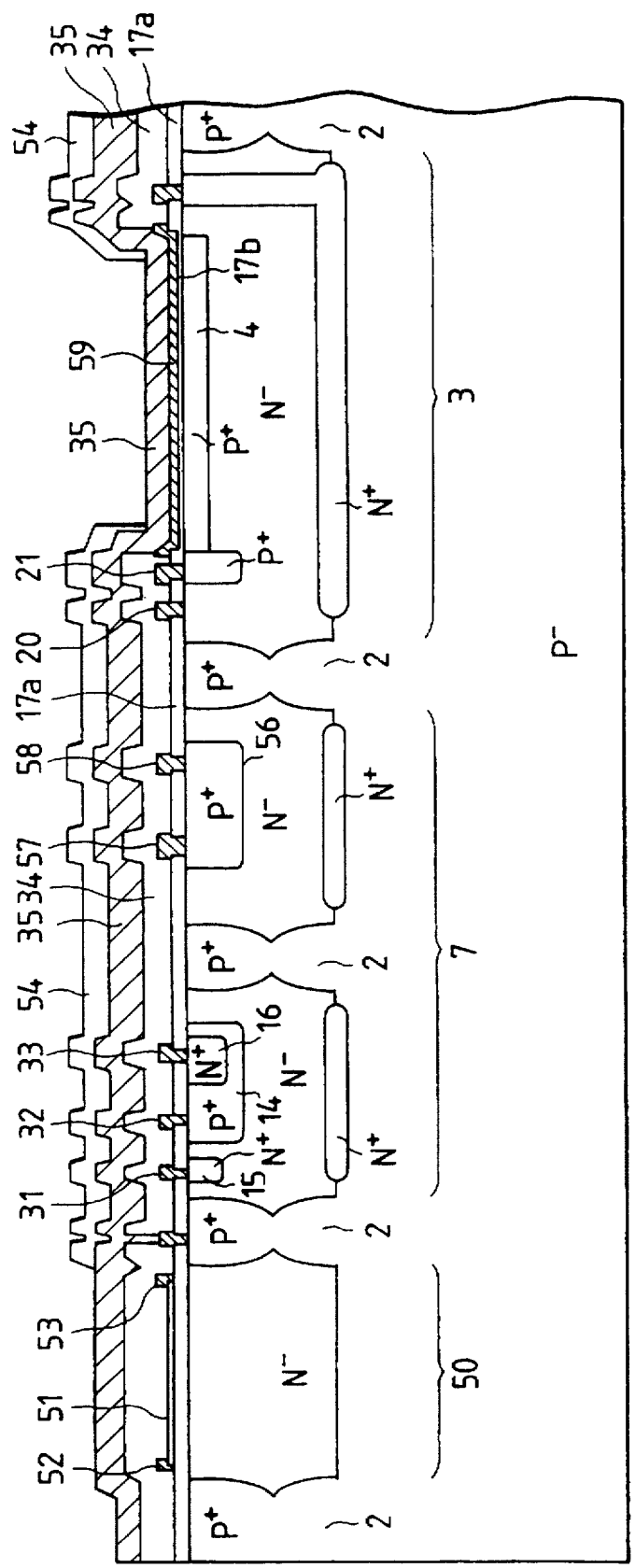
FIG. 28 is a cross sectional view of the photo-sensor in a manufacturing step of the manufacturing method according to the third embodiment.
Figure 29:
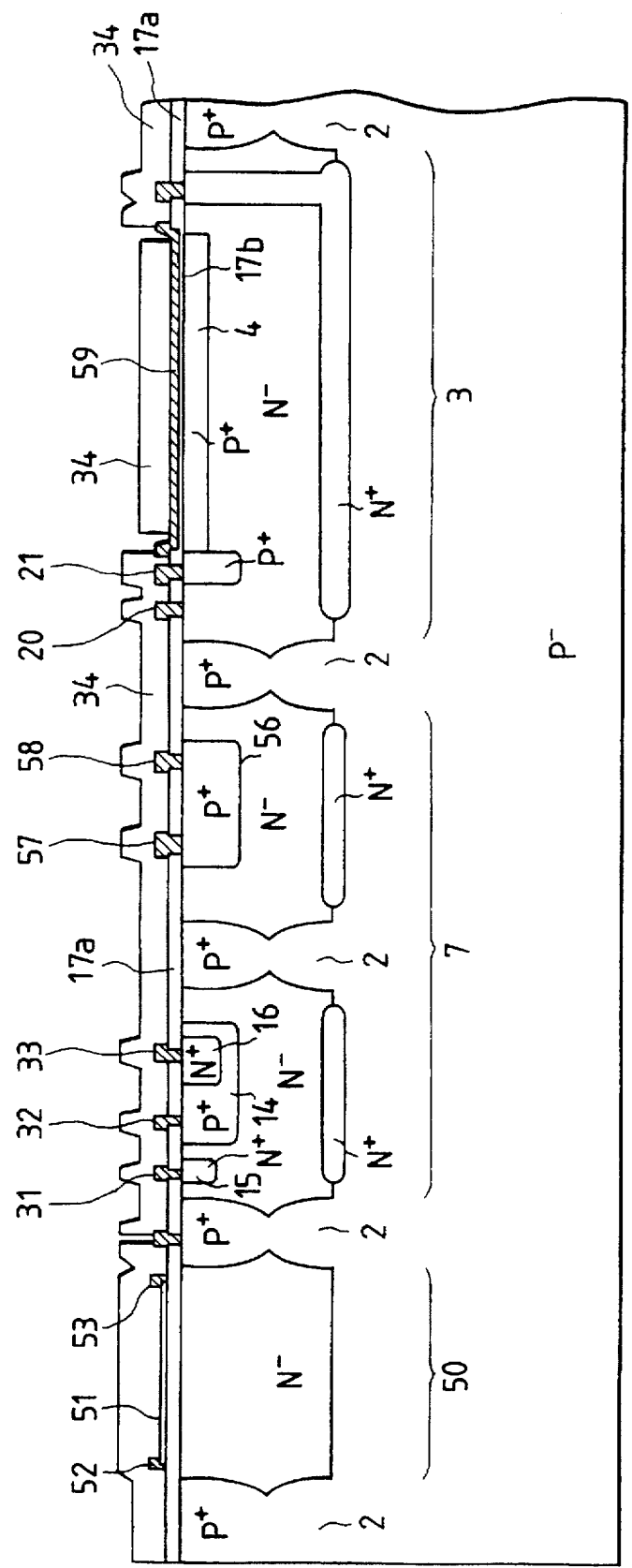
FIG. 29 is a cross sectional view of the photo-sensor in a manufacturing step of the manufacturing method according to a fourth embodiment.

Thereafter, as shown in FIG. 28, a surface protective film 54 made of silicon nitride is formed on the aluminum thin film 35 at a thickness of 500 nm according to a CVD method. Thereafter, a portion of the surface protective film 54 placed in the light receiving region (or on the aluminum thin film 59), portions of the surface protective film 54 placed on the pad electrodes 36, portions of the inter-layer insulating film 34 placed on the pad electrodes 36 and a portion of the surface protective film 54 placed on the laser trim adjusting thin-film resistive element 51 are removed according to a dry etching.

Thereafter, as shown in FIG. 21, a portion of the aluminum thin film 35 placed in the light receiving region (or on the thermal oxide film 17b), a central portion of the aluminum thin film 59 placed in the light receiving region (or on the thermal oxide film 17b) and a portion of the aluminum thin film 35 placed on the laser trim adjusting thin-film resistive element 51 are simultaneously removed according to a photo-etching.

Thereafter, a laser trimming is performed for the laser trim adjusting thin-film resistive element 51, and the concave portion 49 shown in FIG. 20 is formed in the laser trim adjusting thin-film resistive element 51. In this case, because any portion of the aluminum thin film 35 or any portion of the surface protective film 54 is not arranged on the laser trim adjusting thin-film resistive element 51, a process window of a laser energy in the laser trimming is not narrowed, and a superior trimming characteristic in the laser energy can be obtained.

Accordingly, the third embodiment has following features.

(1) As shown in FIGS. 21 and 28, because the portion of the aluminum thin film 35 placed on the laser trim adjusting thin-film resistive element 51 is removed, the laser trimming for the laser trim adjusting thin-film resistive element 51 can be performed with high accuracy on condition that any aluminum thin film 35 is not placed on the laser trim adjusting thin-film resistive element 51.

(2) As shown in FIG. 28, because the aluminum thin film 35 remains on the laser trim adjusting thin-film resistive element 51 when the portion of the surface protective film 54 placed on the laser trim adjusting thin-film resistive element 51 is dry-etched and removed, the dry etching of a portion of the inter-layer insulating film 34 placed on the laser trim adjusting thin-film resistive element 51 can be prevented when the portion of the surface protective film 54 is dry-etched. Therefore, even though the dry etching is performed for the surface protective film 54, a change of a film thickness of the inter-layer insulating film 34 is prevented, so that the laser trimming can be stably performed with high accuracy.

(3) The portion of the aluminum thin film 35 placed in the light receiving region and the central portion of the aluminum thin film 59 placed in the light receiving region are photo-etched and removed at the same time that the portion of the aluminum thin film 35 placed on the laser trim adjusting thin-film resistive element 51 is photo-etched and removed. That is, the portion of the aluminum thin film 35 placed in the light receiving region and the portion of the aluminum thin film 35 placed on the laser trim adjusting thin-film resistive element 51 can be simultaneously performed. Therefore, it is not required to additionally perform a removing step for removing the portion of the aluminum thin film 35 placed on the laser trim adjusting thin-film resistive element 51, and the photo-sensor 48 according to the third embodiment can be easily manufactured.

(Fourth Embodiment)

A configuration of a photo-sensor manufactured according to a fourth embodiment is the same as that shown in FIG. 20 according to the third embodiment. A manufacturing method for manufacturing a photo-sensor according to the fourth embodiment is described with reference to FIGS. 29 to 32.

The manufacturing steps shown in FIGS. 22 to 25 are performed in the fourth embodiment in the same manner as in the third embodiment. Thereafter, the inter-layer insulating film 34 composed of the silicon oxide film having a thickness of 400 nm and the silicon nitride film having a thickness of 500 nm is formed on the aluminum wires 52, 53, 31, 32, 33, 57 and 58, the aluminum thin film 59, the laser trim adjusting thin-film resistive element 51 and the silicon oxide film 17a according to a CVD method.

Figure 30:
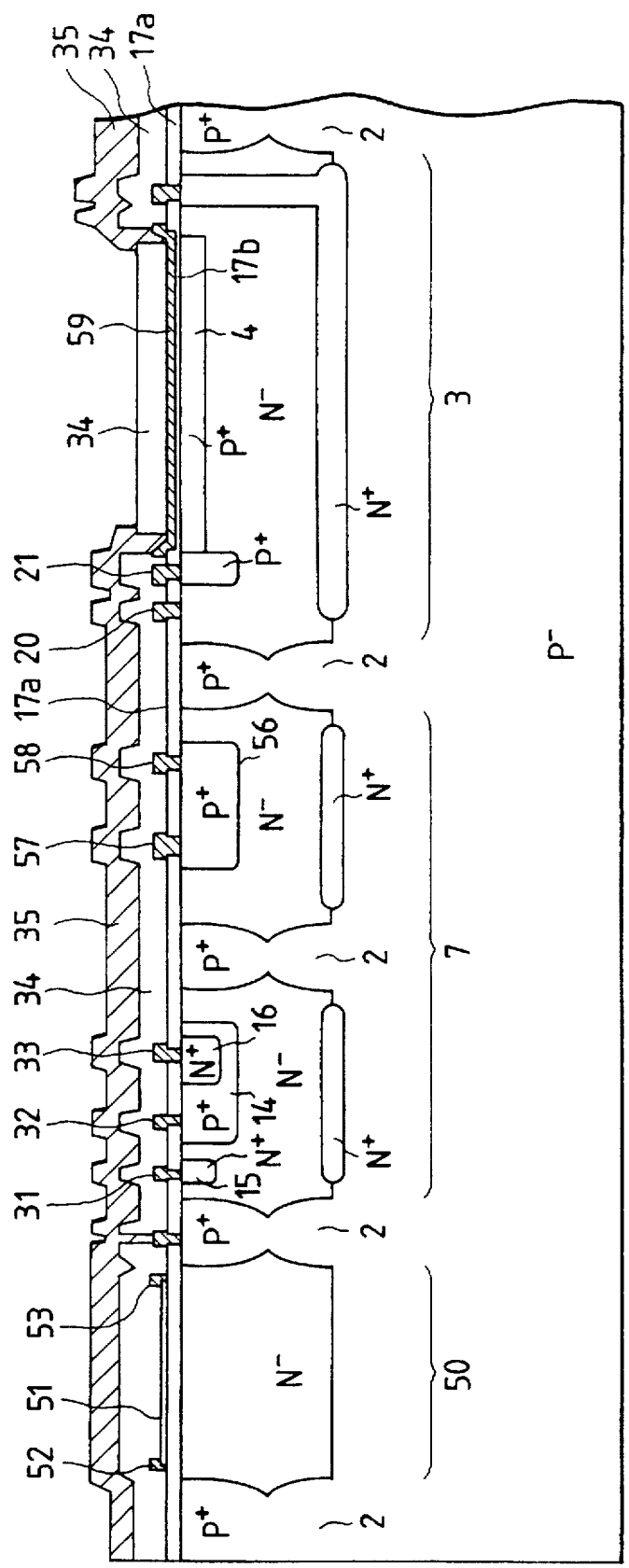
FIG. 30 is a cross sectional view of the photo-sensor in a manufacturing step of the manufacturing method according to the fourth embodiment.

Thereafter, as shown in FIG. 30, the aluminum thin film 35 functioning as a shielding film is formed on the inter-layer insulating film 34 on condition that the inter-layer insulating film 34 is arranged in the light receiving region. The aluminum thin film 35 has a thickness of 1.1 μm. Thereafter, the aluminum thin film 35 is photo-etched and patterned in a shielding film pattern. That is, a portion of the aluminum thin film 35 placed in the light receiving region is removed, and another portion of the aluminum thin film 35 placed on the laser trim adjusting thin-film resistive element 51 remains.

Figure 31:
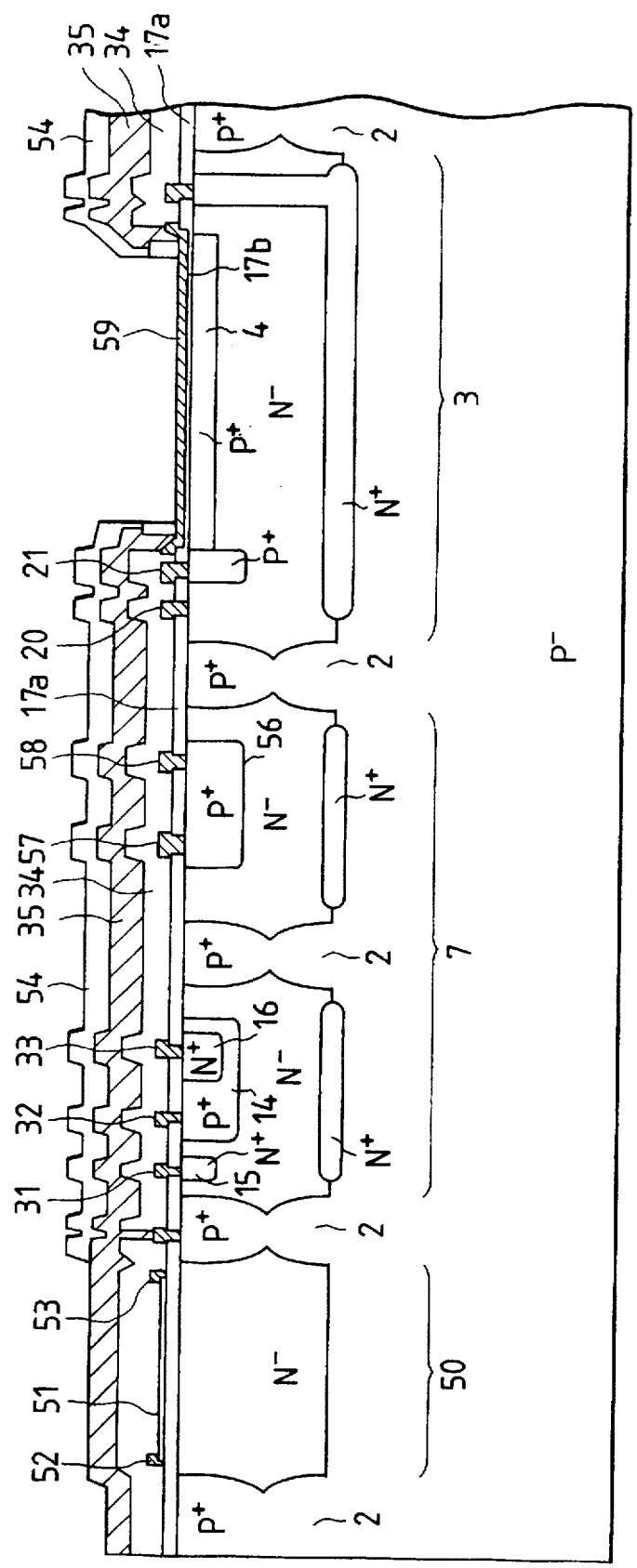
FIG. 31 is a cross sectional view of the photo-sensor in a manufacturing step of the manufacturing method according to the fourth embodiment.

Thereafter, as shown in FIG. 31, the surface protective film 54 made of silicon nitride is formed on the aluminum thin film 35 and the inter-layer insulating film 34 arranged in the light receiving region according to a CVD method at a film thickness of 500 nm. Thereafter, a portion of the surface protective film 54 placed in the light receiving region, a portion of the inter-layer insulating film 34 placed in the light receiving region, portions of the surface protective film 54 placed on the pad electrodes 36, portions of the inter-layer insulating film 34 placed on the pad electrodes 36 and a portion of the surface protective film 54 placed on the laser trim adjusting thin-film resistive element 51 are removed according to a dry etching.

Figure 32:
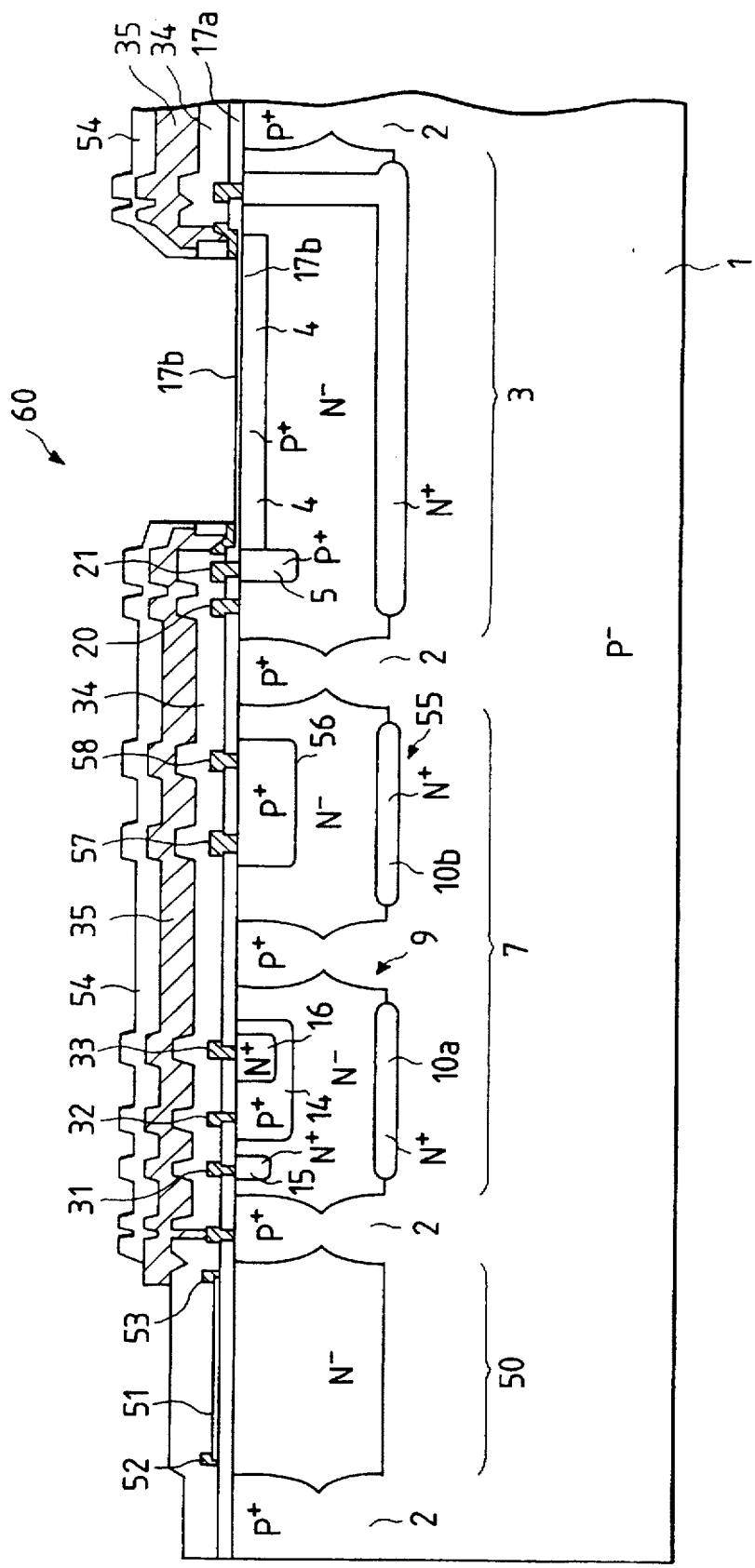
FIG. 32 is a cross sectional view of a photo-sensor manufactured according to the fourth embodiment.

Thereafter, as shown in FIG. 32, the aluminum thin film 59 placed in the light receiving region and a portion of the aluminum thin film 35 placed on the laser trim adjusting thin-film resistive element 51 are simultaneously removed according to a photo-etching. Thereafter, a laser trimming is performed for the laser trim adjusting thin-film resistive element 51, and the concave portion 49 shown in FIG. 20 is formed in the laser trim adjusting thin-film resistive element 51. In this case, because any portion of the aluminum thin film 35 or any portion of the surface protective film 54 is not arranged on the laser trim adjusting thin-film resistive element 51, a process window of a laser energy in the laser trimming is not narrowed, and a superior trimming characteristic in the laser energy can be obtained.

Accordingly, the fourth embodiment has following features.

(1) As shown in FIGS. 31 and 32, because the portion of the aluminum thin film 35 placed on the laser trim adjusting thin-film resistive element 51 is removed, the laser trimming for the laser trim adjusting thin-film resistive element 51 can be performed with high accuracy on condition that any aluminum thin film 35 is not placed on the laser trim adjusting thin-film resistive element 51.

(2) As shown in FIGS. 31 and 32, because the aluminum thin film 59 placed in the light receiving region and the portion of the aluminum thin film 35 placed on the laser trim adjusting thin-film resistive element 51 are simultaneously etched and removed, a photo-sensor 60 according to the fourth embodiment can be easily manufactured.

Therefore, the same effect as that in the third embodiment can be obtained in the fourth embodiment.

In the first to fourth embodiment, the thermal oxide film 17b is used as an insulating film with which the $P^+$ type region 4 functioning as a light receiving element of the photo diode device 3 (or the photoelectric transfer device) is covered. However, it is applicable that the $P^+$ type region 4 be covered with a nitride film such as a silicon nitride film. In this case, the nitride film can be correctly formed at a desired film thickness as compared with the $SiO_2$ film formed as the inter-layer insulating film 73 according to the CVD method. Also, it is applicable that the $P^+$ type region 4 be covered with a laminated film composed of a thermal oxide film and a nitride film.

Also, aluminum is used as the first metallic film to form the aluminum wires 20, 21 and 28 to 33 or the aluminum wires 52, 53, 31, 32, 33, 57 and 58. However, any metal useful as a wiring material can be used as the first metallic film.

Also, the second metallic film such as the aluminum thin film 35 or the aluminum thin film 42 is used in the first to fourth embodiments. However, the second metallic film can be made of a metallic material other than aluminum. Also, in cases where the second metallic film be made of the same metallic material as that of the first metallic film, the first metallic film placed in the light receiving region and the second metallic film can be etched and removed in the same etching step. Also, even though the second metallic film is made of a metallic material different from that of the first metallic film, in cases where the metallic materials of the first and second metallic films can be etched in the same etching method, the metallic materials of the first and second metallic films are useful.

Also, a material of the inter-layer insulating film 34, a thickness of the inter-layer insulating film 34 and a forming method of the inter-layer insulating film 34 are not limited to one of the first to fourth embodiments on condition that the inter-layer insulating film 34 has a superior insulating characteristic.

Also, the aluminum thin film 39 placed on the silicon oxide film 17b (or the light receiving element) is removed according to the wet etching. However, it is applicable that the aluminum thin film 39 be removed according to a dry etching. In this case, when the metallic materials of the first and second metallic films can be etched in the same etching method, the etching of the aluminum thin film 39 denoting the first metallic film can be easily performed.

Also, it is applicable that the surface protective film 54 used in the third or second embodiment be arranged in the photo-sensor according to the first or second embodiment.

Next, another concept according to the present invention is described.

In general, when an oxide film is formed in a light receiving region, the oxide film cannot be correctly formed at a desired size. In particular, because there are various manufacturing steps when a photo-sensor is manufactured, a film thickness of the oxide film formed at a film thickness is changed in each manufacturing step, so that a plurality of oxide films formed in a large-scale manufacturing cannot have the same film thickness. Therefore, there is a drawback that a light receiving characteristic of a light receiving element placed under the oxide film changes each time one light receiving element is formed.

Figure 33:
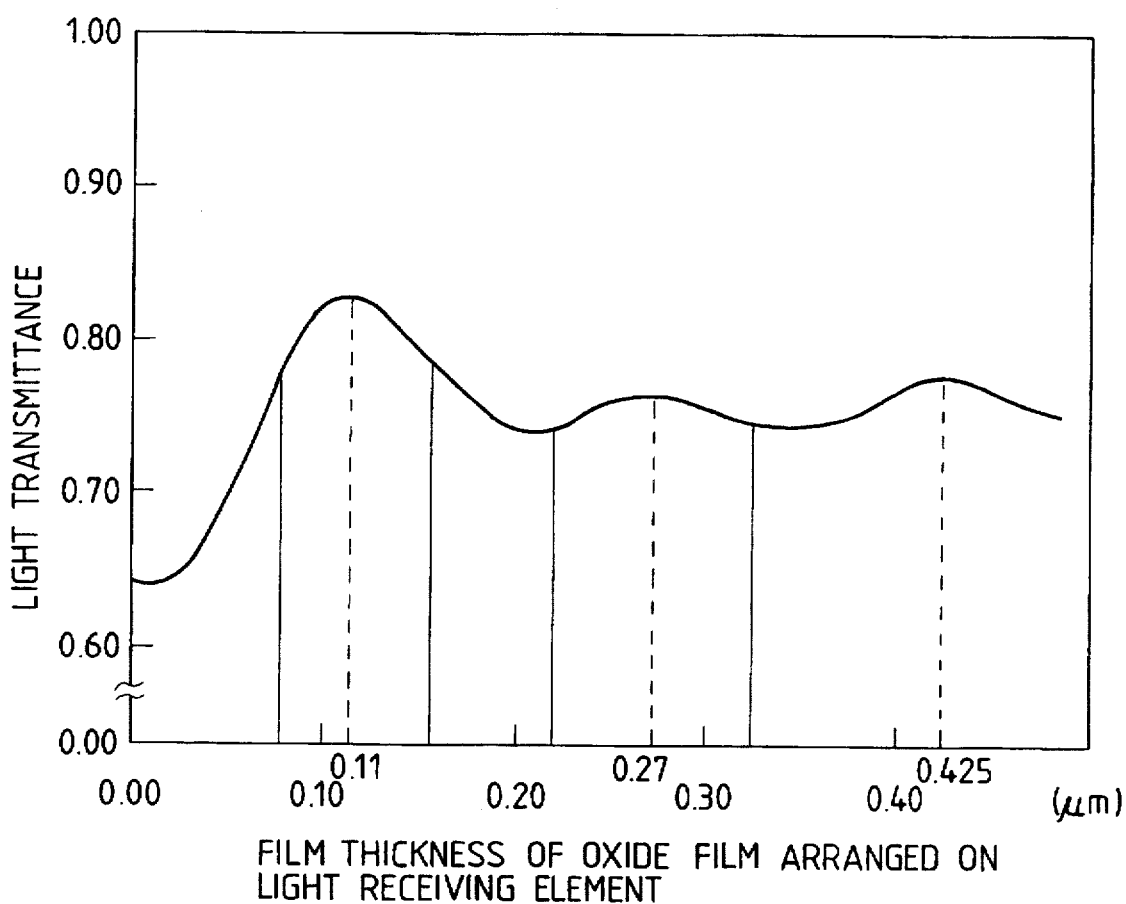
FIG. 33 shows a simulation result indicating a relationship between a light transmittance and a film thickness of an oxide film arranged on a light receiving element.

FIG. 33 shows a simulation result indicating a relationship between a light transmittance and a film thickness of an oxide film arranged on a light receiving element. Here, the light transmittance denotes a ratio of an intensity of light transmitting through the light receiving element to an intensity of light incident on the oxide film. In FIG. 33, a ratio of an intensity of pseudo-sunlight transmitting to the silicon substrate 1 through the $P^+$ type region 4 to an intensity of pseudo-sunlight incident on an oxide film arranged on a light receiving element is shown.

The light transmittance depends on refractive indexes of light in the air, the oxide film and the light receiving element (or the $P^+$ type region 4), and a refractive index of light in a material depends on a property of the material and a thickness of the material. In cases where a film thickness of the oxide film is very thin and is close to a wavelength of the light, the refractive index of the light in the oxide film depends on the film thickness of the oxide film. Therefore, the light transmittance periodically changes with respect to the film thickness of the light receiving element.

As shown in FIG. 33, the light transmittance is maximized at the film thickness of 1100 Å (called a first peak point), and a maximum peak value of the light transmittance at the first peak point is about 0.83. However, a changing degree of the light transmittance is very high in the neighborhood of the first peak point at which the light transmittance is maximized. Therefore, when the film thickness of the oxide film placed on the light receiving element shifts from the first peak point, a light receiving characteristic of a photo-sensor considerably changes. In contrast, the light transmittance gradually changes in the neighborhood of the film thickness of 2700 Å (called a second peak point). Also, the light transmittance gradually changes in the neighborhood of the film thickness of 4250 Å (called a third peak point). Therefore, in cases where the film thickness of the oxide film is targeted for 2700 Å (the second peak point) or 4250 Å (the third peak point) other than the first peak point at which the light transmittance is maximized, the change of a light receiving characteristic of a photo-sensor is small even though the film thickness of the oxide film is not correctly set to 2700 Å or 4250 Å.

Therefore, in a following embodiment, the film thickness of the oxide film is targeted for a peak point other than a first peak point at which the light transmittance is maximized. That is, in a manufacturing method for manufacturing a photo-sensor in which an insulating film is arranged on a light receiving element of a photoelectric transfer device arranged on a semiconductor substrate, the insulating film is formed on condition that a film thickness of the insulating film approaches a second peak value other than a first peak value at which a light transmittance of light transmitting to the photoelectric transfer device through the light receiving element is maximized and the light transmittance in the neighborhood of the second peak value gradually decreases as the film thickness of the insulating film becomes far from the second peak value.

Therefore, even though the film thickness of the insulating film arranged on the light receiving element is not correctly set to the second peak value, a change of a light transmittance of light transmitting to the photoelectric transfer device through the light receiving element is small, so that a light receiving characteristic of a photo-sensor can be improved.

(Fifth Embodiment)

Hereinafter, a fifth embodiment according to the above concept of the present invention is described.

Figure 34:
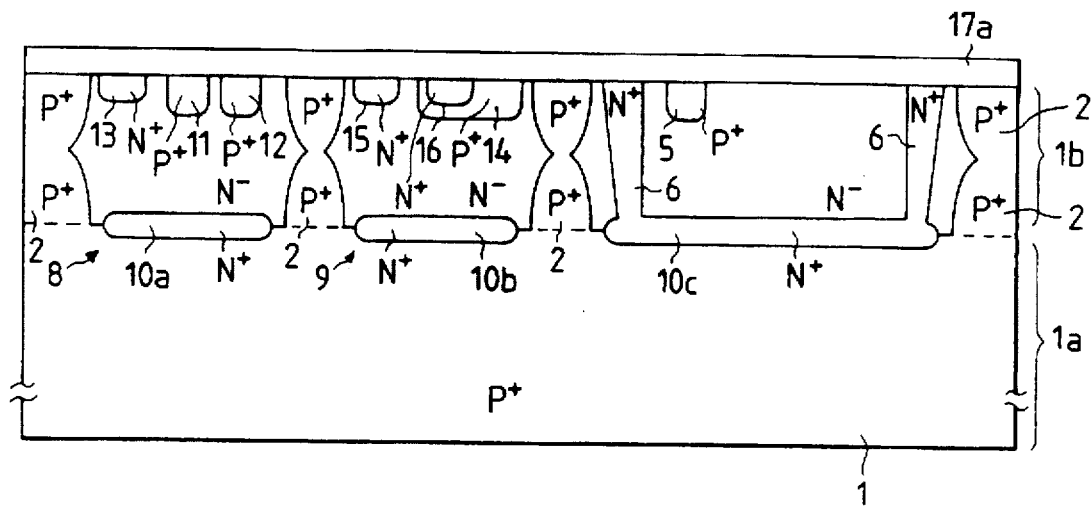
FIG. 34 is a cross sectional view of a photo-sensor in a manufacturing step of a manufacturing method according to a fifth embodiment.
Figure 35:
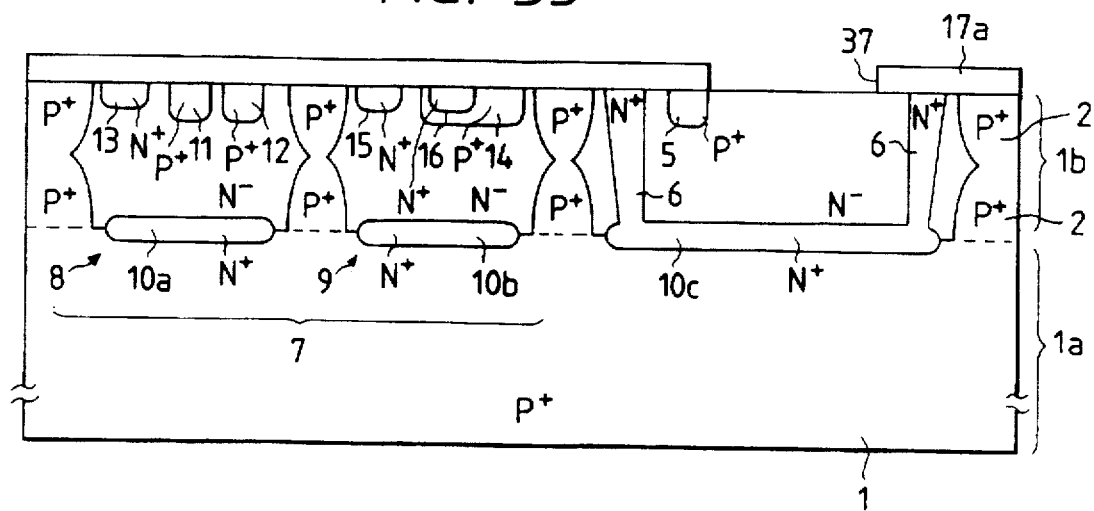
FIG. 35 is a cross sectional view of the photo-sensor in a manufacturing step of the manufacturing method according to the fifth embodiment.
Figure 36:
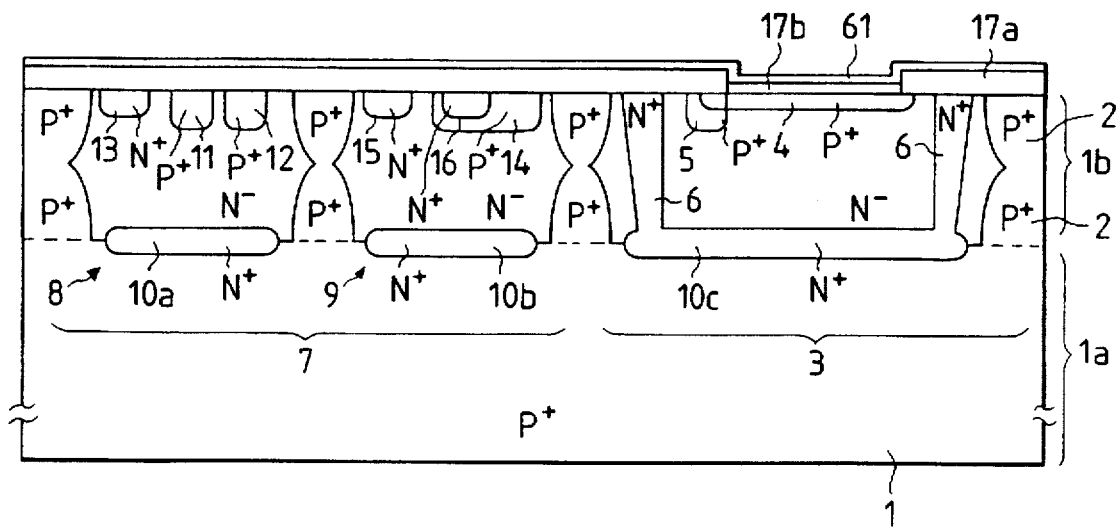
FIG. 36 is a cross sectional view of the photo-sensor in a manufacturing step of the manufacturing method according to the fifth embodiment.

As shown in FIG. 34, various devices such as a transistor and a diffused resistor are formed on the epitaxially grown silicon substrate 1 according to a diffusing method used for the IC manufacturing, in the same manner as in the first to fourth embodiments. Thereafter, as shown in FIG. 35, a portion of the silicon oxide film 17a placed in a light receiving region in which a light receiving element is planned to be formed is selectively removed according to a photo-etching, and the opening portion 37 of the silicon oxide film 17a is formed. Thereafter, as shown in FIG. 36, the silicon oxide film (or thermal oxide film) 17b is formed at a thickness of 1050 Å in the opening portion 37 placed on the surface of the silicon substrate 1 according to a thermal oxidation, and the P⁺ type region 4 is formed under the silicon oxide film 17b. Therefore, the photo diode device 3 and the signal processing circuit 7 are formed in the silicon substrate 1, and the silicon oxide film 17b is arranged on the light receiving element (or the P⁺ type region 4) of the photo diode device 3, in the same manner as in the first to fourth embodiments. In this embodiment, an N⁺ type region 6 is circularly formed in the N⁺ type epitaxial layer 1b of the photo diode device 3 to surround the P⁺ type region 4, and the N⁺ type region 6 is connected with an N⁺ type buried layer 10c arranged between the N⁺ type epitaxial layer 1b and the P⁺ type silicon substrate 1a in the photo diode device 3.

Thereafter, a phosphorous oxide film 61 is formed on the silicon oxide film 17a and the silicon oxide film 17b to protect the silicon oxide film 17a and the silicon oxide film 17b. That is, the phosphorous oxide film 61 is deposited on the films 17a and 17b according to a CVD method, and a film thickness of the phosphorous oxide film 61 is set to 1650 Å. Therefore, a total film thickness of a combined oxide film (the silicon oxide film 17b and the phosphorous oxide film 61) arranged on the light receiving element (or the P⁺ type region 4) reaches 2700 Å (1050 Å+1650 Å).

Thereafter, the silicon oxide film 17b and the phosphorous oxide film 61 are thermally processed. Therefore, the total film thickness of the combined oxide film is increased by 50 Å and reaches 2750 Å.

After the thermal oxidation, a capacitor oxidation is performed for the silicon substrate 1. In this capacitor oxidation, a capacitor is formed in a prescribed capacitor region (not shown) of the silicon substrate 1. In this case, the total film thickness of the combined oxide film arranged on the light receiving element is moreover increased. In detail, a capacitor opening portion is formed in the silicon oxide film 17a, and an upper portion of the silicon substrate 1 is exposed to the capacitor opening portion. Thereafter, the exposed portion of the silicon substrate 1 is thermally oxidized, and a silicon oxide film exposed to the capacitor opening portion is formed on the silicon substrate 1. In this case, because the capacitor thermal oxidation is performed not only for the capacitor region of the silicon substrate 1 but also for the combined oxide film arranged on the light receiving element. Therefore, the total film thickness of the combined oxide film is increased by about 500 Å and reaches about 3250 Å (2700 Å+50 Å+500 Å).

Thereafter, a thin film for adjusting a circuit is formed on the silicon substrate 1. The thin film is made of chrome-silicon and functions as a resistor. Thereafter, the thin film is patterned according to a photo-etching on condition that a patterned thin film is arranged in a region other than the light receiving region. In this case, because the photo-etching for the thin film is performed not only for the thin film but also for the combined oxide film arranged on the light receiving element, a film thickness of the combined oxide film is decreased by about 400 Å.

Figure 37:
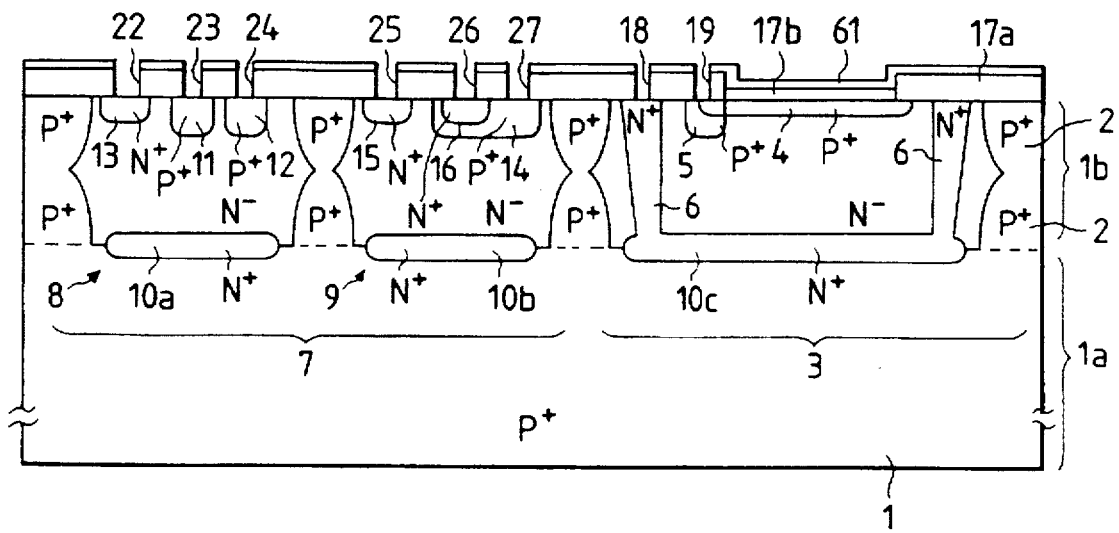
FIG. 37 is a cross sectional view of the photo-sensor in a manufacturing step of the manufacturing method according to the fifth embodiment.
Figure 38:
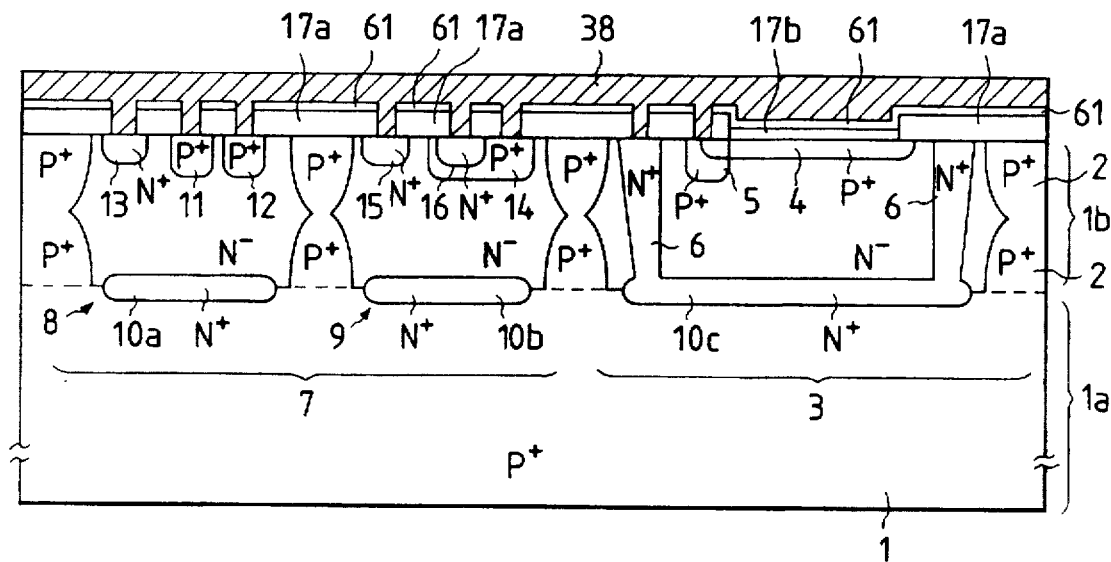
FIG. 38 is a cross sectional view of the photo-sensor in a manufacturing step of the manufacturing method according to the fifth embodiment.
Figure 39:
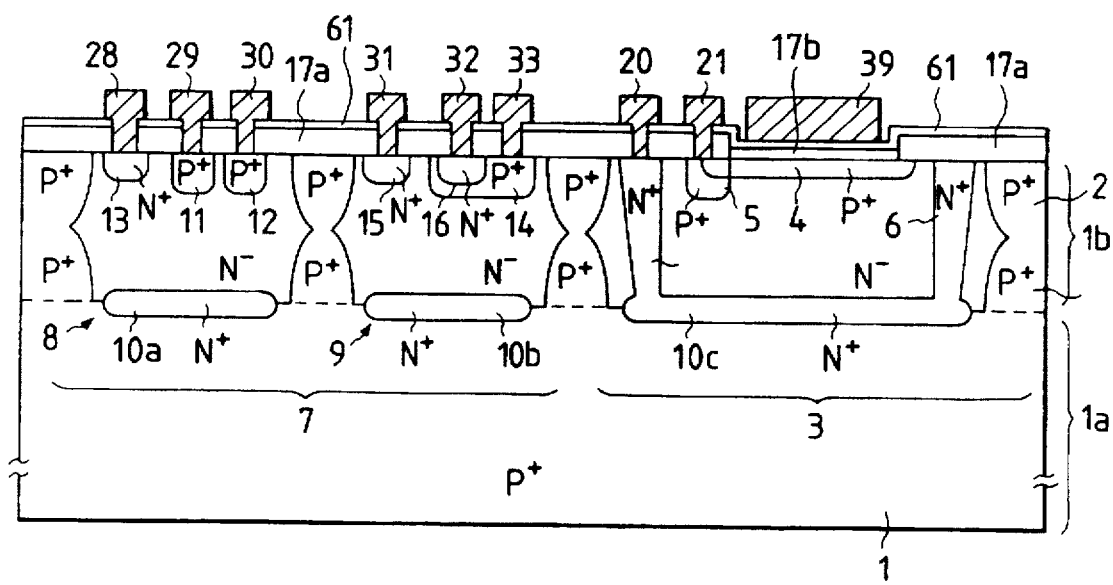
FIG. 39 is a cross sectional view of the photo-sensor in a manufacturing step of the manufacturing method according to the fifth embodiment.

Thereafter, as shown in FIG. 37, a plurality of prescribed regions of the combine oxide film (the silicon oxide film 17b and the phosphorous oxide film 61) are etched and opened, and a plurality of contact holes 18, 19, 22, 23, 24, 25, 26 and 27 are formed in the combine oxide film. Thereafter, as shown in FIG. 38, the aluminum thin film 38 denoting a first metallic film is deposited over the entire surface of the silicon substrate 1, and the contact holes are covered with the aluminum thin film 38. Thereafter, as shown in FIG. 39, the aluminum thin film 38 is photo-etched and patterned to form a plurality of aluminum wires 20, 21, 28, 29, 30, 31, 32 and 33. For example, a wet etching using a phosphoric acid or a nitric acid as an etchant is performed as the photo-etching. In this case, a portion of the aluminum thin film 38 placed on the light receiving element is not etched, and the portion of the aluminum thin film 38 remains as the aluminum thin film 39. The aluminum thin film 39 functions as a protective film for protecting the silicon oxide film 17b.

Figure 40:
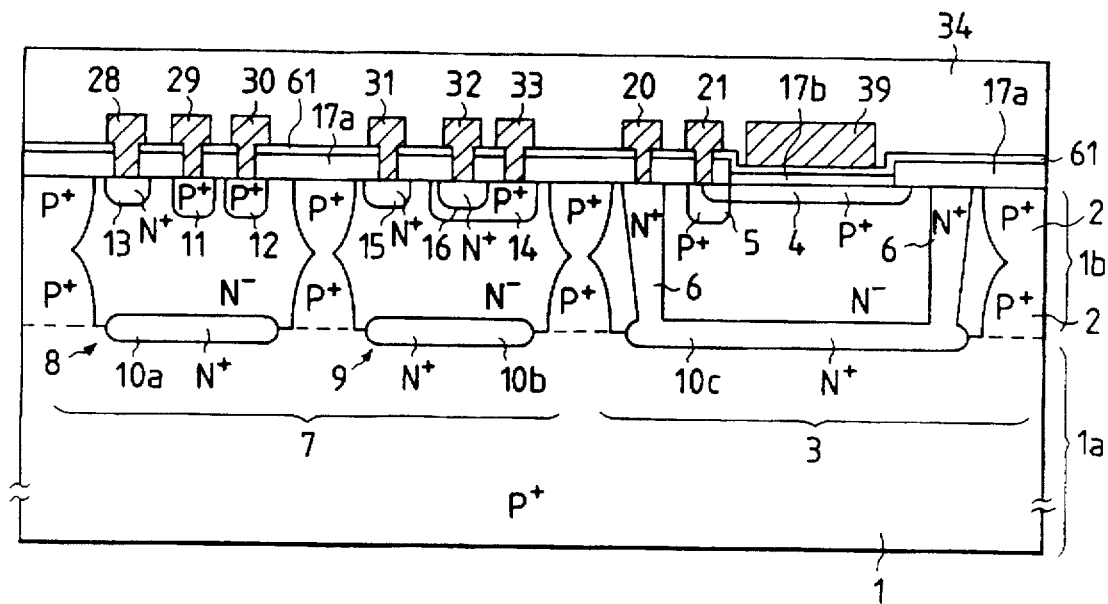
FIG. 40 is a cross sectional view of the photo-sensor in a manufacturing step of the manufacturing method according to the fifth embodiment.
Figure 41:
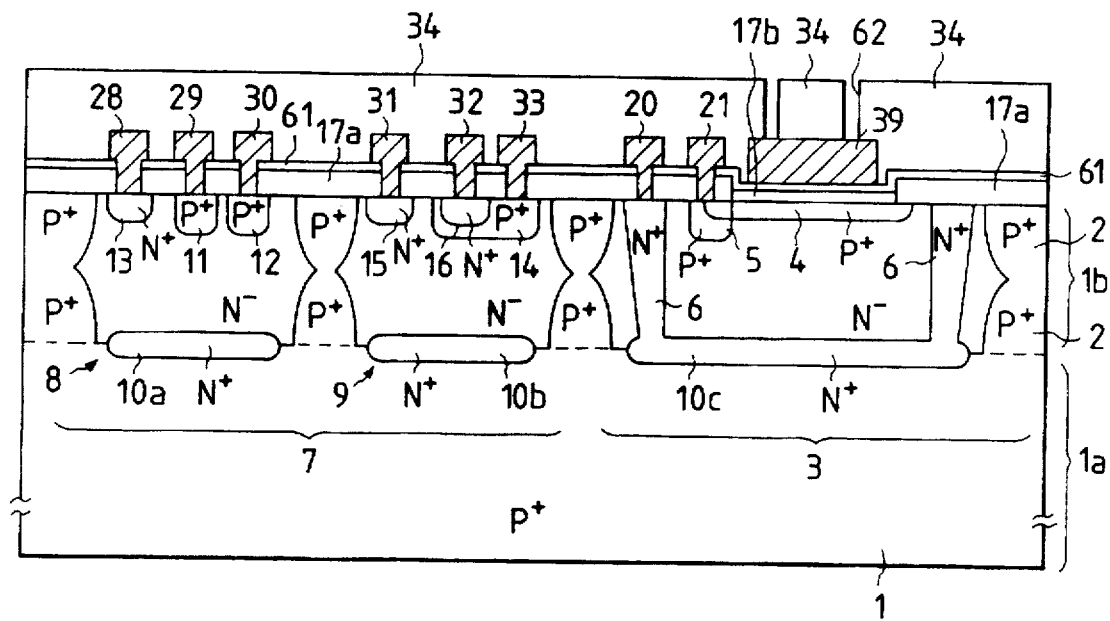
FIG. 41 is a cross sectional view of the photo-sensor in a manufacturing step of the manufacturing method according to the fifth embodiment.

Thereafter, as shown in FIG. 40, the inter-layer insulating film 34 is deposited over the entire surface of the silicon substrate 1. In the deposition of the inter-layer insulating film 34 in this embodiment, a first tetra-ethyl-ortho-silicate (TEOS) oxide film is deposited, a spin-on-glass (SOG) coating is performed for the first TEOS oxide film to form an SOG film on the first TEOS oxide film, an etch-back is performed for the first TEOS oxide film and the SOG film, and a second TEOS oxide film is again deposited on the SOG film. Therefore, the inter-layer insulating film 34 is composed of the first TEOS oxide film, the SOG film and the second TEOS oxide film. Thereafter, as shown in FIG. 41, a portion of the inter-layer insulating film 34 placed on the aluminum thin film 39 is cylindrically photo-etched and removed to form an opening portion 62 in a cylindrical shape. In this photo-etching, a wet etching using a HF type etchant is performed to remove the portion of the inter-layer insulating film 34.

Figure 42:
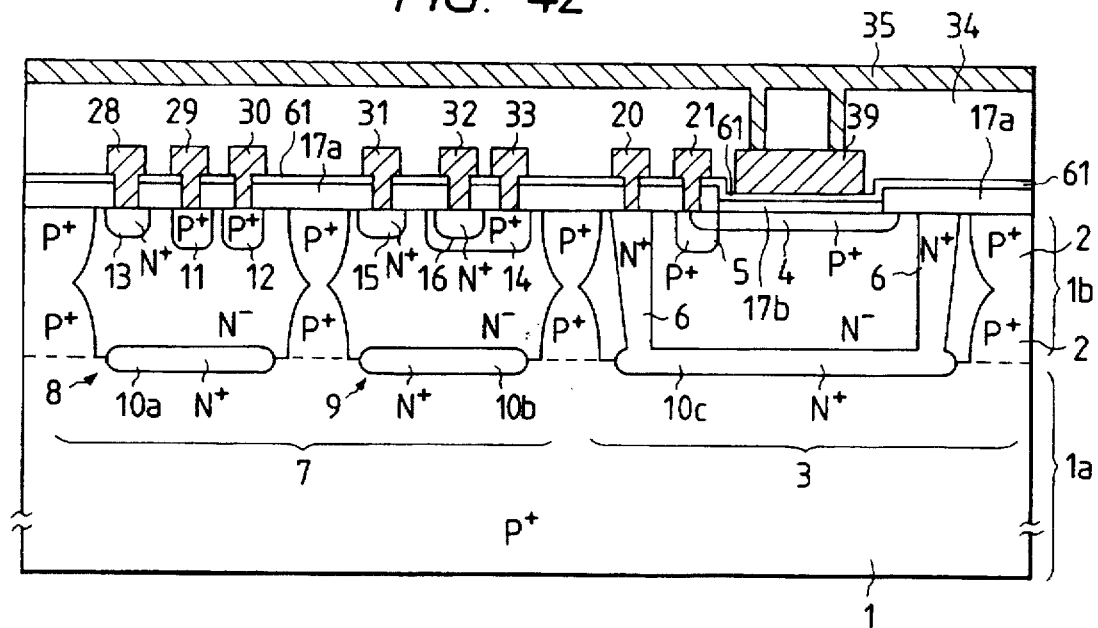
FIG. 42 is a cross sectional view of the photo-sensor in a manufacturing step of the manufacturing method according to the fifth embodiment.
Figure 43:
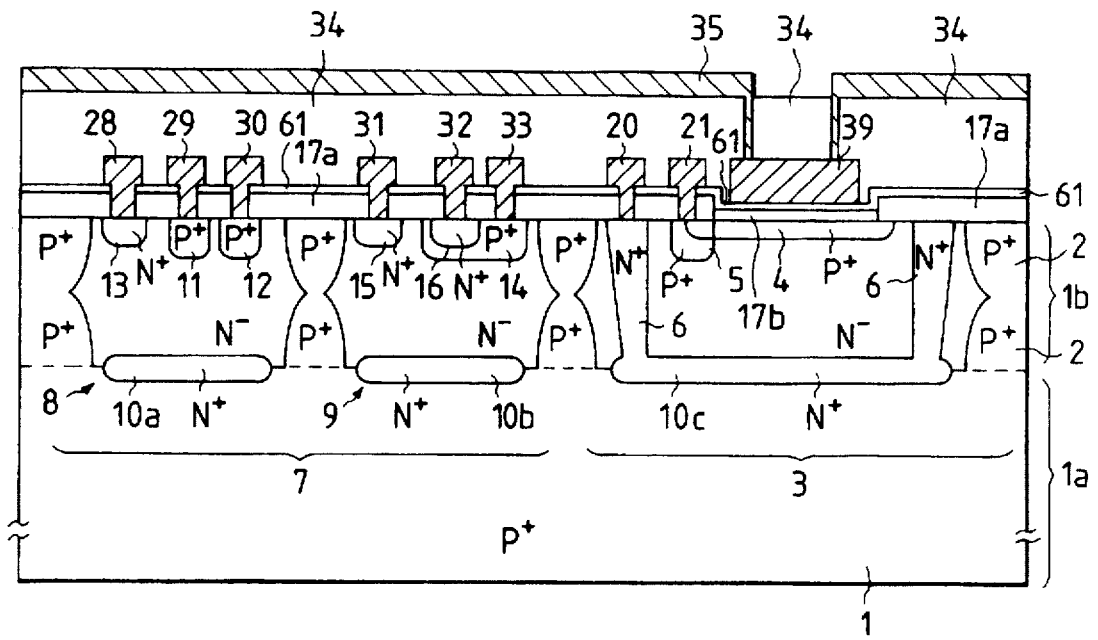
FIG. 43 is a cross sectional view of the photo-sensor in a manufacturing step of the manufacturing method according to the fifth embodiment.

Thereafter, as shown in FIG. 42, the aluminum thin film 35 denoting a second metallic film is deposited on the inter-layer insulating film 34 including a portion of the inter-layer insulating film 34 placed in the light receiving region. Thereafter, as shown in FIG. 43, a portion of the aluminum thin film 35 placed on a portion of the inter-layer insulating film 34, which is arranged on a central portion of the aluminum thin film 39, is etched and removed according to a wet etching. In this case, the aluminum thin film 35 placed on the signal processing circuit 7 remains. Thereafter, the portion of the inter-layer insulating film 34 on the central portion of the aluminum thin film 39 is removed. In this case, the light receiving region of the photo diode device 3 is surrounded by the aluminum thin film 35 and the aluminum thin film 39.

Figure 44:
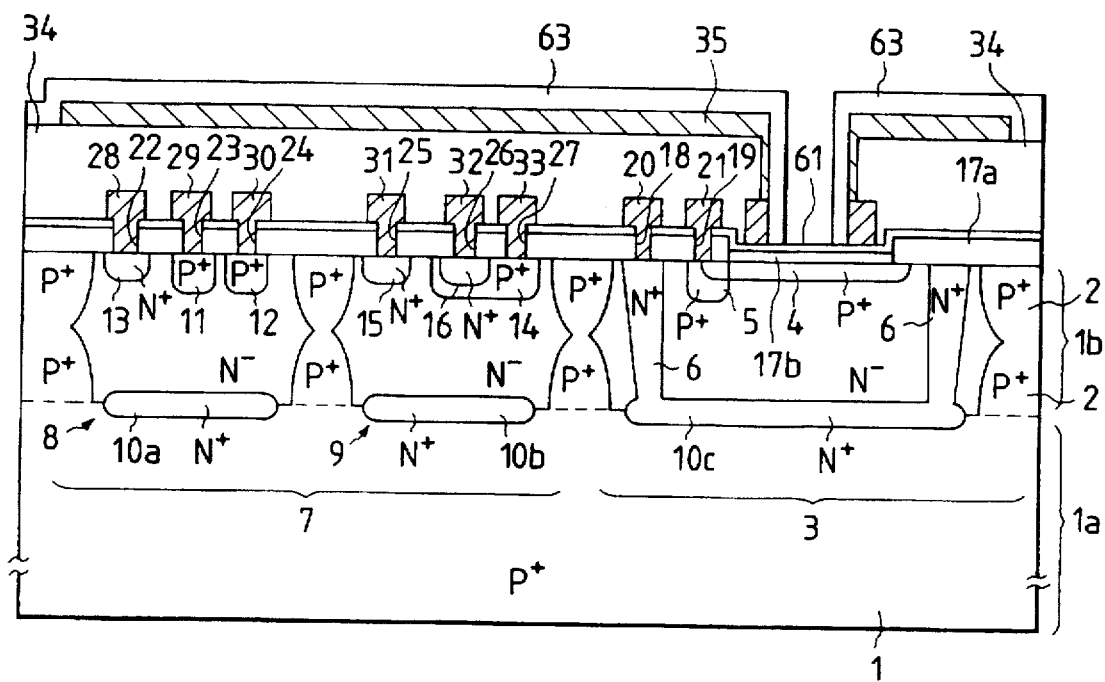
FIG. 44 is a cross sectional view of the photo-sensor manufactured according to the manufacturing method of the fifth embodiment.

Thereafter, a silicon nitride film 63 is deposited over the entire surface of the silicon substrate 1 at a film thickness of 1600 nm according to a plasma CVD method. The silicon nitride film 63 functions as a passivation film. Thereafter, a portion of the silicon nitride film 63 placed in the light receiving region is removed. Also, in succession to the removal of the portion of the silicon nitride film 63, the central portion of the aluminum thin film 39 placed in the light receiving region is etched and removed by using an etchant of phosphoric acid. Therefore, a photo-sensor 64 shown in FIG. 44 is obtained.

Thereafter, a silicon nodule etching is finally performed for the remaining portion of the aluminum thin film 39 and the remaining portion of the aluminum thin film 35. Because each of the aluminum thin films 35 and 39 contains 1% silicon, the silicon nodule etching is performed to remove the silicon from each of the aluminum thin films 35 and 39. In this case, because the aluminum thin film 39 arranged on the phosphorous oxide film 61 has been already removed, the phosphorous oxide film 61 arranged on the P⁺ type region 4 (or the light receiving element) is exposed to the atmosphere, so that a film thickness of the combined oxide film composed of the silicon oxide film 17b and the phosphorus oxide film 61 is decreased by performing the silicon nodule etching. To be concrete, the decrease of the film thickness of the combined oxide film is about 100 Å. Therefore, the film thickness of the combined oxide film reaches about 2700 Å (for example, 2750 Å).

As is described above, because the film thickness of the combined oxide film is increased or decreased each time one manufacturing step is performed, an insulating film formed in the light receiving region denotes several oxide films such as the silicon oxide film 17b, the phosphorus oxide film 61, an oxide film generated in the combined oxide film by performing the thermal oxidation, an oxide film generated in the combined oxide film by performing the capacitor oxidation, an oxide film lost from the combined oxide film by performing the photo-etching for the thin film and an oxide film lost from the combined oxide film by performing the silicon nodule etching. Though the film thickness of the combined oxide film finally reaches about 2700 Å as a standard case, because the increased or decreased value of the film thickness of the combined oxide film in each manufacturing step is merely a standard value, the film thickness of the combined oxide film (or the insulating film) does not necessarily reach about 2700 Å.

To be concrete, the film thickness of the silicon oxide film 17b, the film thickness of the phosphorus oxide film 61 and the film thickness of the oxide film generated by performing the capacitor oxidation respectively shift 10% of its standard value at its maximum. Therefore, the film thickness of the combined oxide film ranges from 3200−320 Å to 3200+320 Å. Also, the film thickness of the oxide film generated by performing the thermal oxidation shifts from its standard value (50 Å). Also, the film thickness of the oxide film lost by performing the photo-etching for the thin film shifts from its standard value (400 Å) and ranges from 300 Å to 600 Å. Also, the film thickness of the oxide film lost by performing the silicon nodule etching shifts from its standard value (100 Å), and there is a case that the film thickness of the oxide film reaches 200 Å.

As a result, the film thickness of the combined oxide film ranges from 2130 Å to 3170 Å when all manufacturing steps are performed. In practice, the film thickness of the combined oxide film shifts within 20% of its standard value (2700 Å). In this embodiment, he film thickness of the combined oxide film ranges from 2757−144 Å to 2757+144 Å.

Therefore, as shown in FIG. 33, because a changing degree of the light transmittance with respect to the film thickness of the combined oxide film placed on the light receiving element is low at the film thickness of 2700 Å (0.27 μm) as compared with a changing degree of the light transmittance at the film thickness of 1100 Å (0.11 μm), the change of the light transmittance in the photo-sensor 64 is low, and the change of the light receiving characteristic in the photo-sensor 64 is low.

Accordingly, because the film thickness of the combined oxide film placed on the light receiving element is targeted for the second peak point (2700 Å) in the relationship between the light transmittance and the film thickness of the combined oxide film, the change of the light transmittance becomes low. That is, even though the film thickness of the combined oxide film shifts from its standard value after the manufacturing steps are performed, the shift of the light transmittance from its standard value is low, and the change of the light receiving characteristic in the photo-sensor 64 can be minimized. That is, the light receiving characteristic in the photo-sensor 64 can be improved.

Also, assuming that the film thickness of the combined oxide film placed on the light receiving element is targeted for the first peak point (1100 Å), the film thickness of the silicon oxide film 17b and the film thickness of the phosphorus oxide film 61 necessarily shift from those standard values. Also, because an increase degree of the film thickness of the oxide film generated by performing the capacitor oxidation, a decrease degree of the film thickness of the oxide film lost by performing the photo-etching for the thin film and a decrease degree of the film thickness of the oxide film lost by performing the silicon nodule etching are the same as those in this embodiment, the film thickness of the combined oxide film placed on the light receiving element considerably shifts from the first peak point (1100 Å). Accordingly, in cases where a photo-sensor is manufactured by setting the film thickness of the combined oxide film placed on the light receiving element to the first peak point (1100 Å), a light receiving characteristic in the photo-sensor cannot be stably obtained in the same manner as that in the photo-sensor 64.

In the fifth embodiment, the film thickness of the combined oxide film composed of the silicon oxide film 17b and the phosphorus oxide film 61 is targeted for the second peak point (2700 Å). However, even though the film thickness of the combined oxide film is targeted for the third peak point (4250 Å) or one of other peak points following the third peak point, a light receiving characteristic can be stably obtained in the photo-sensor. However, though the light receiving characteristic obtained when the film thickness of the combined oxide film is targeted for the third peak point (4250 Å) or one of other peak points following the third peak point is superior to that obtained when the film thickness of the combined oxide film is targeted for the first peak point (1100 Å), because the film thickness of the combined oxide film is increased when the film thickness of the combined oxide film is targeted for the third peak point (4250 Å) or one of other peak points following the third peak point, a difference between the film thickness of the combined oxide film actually obtained and a target value becomes larger than that determined when the film thickness of the combined oxide film is targeted for the second peak point (2700 Å). Therefore, it is best that the film thickness of the combined oxide film is targeted for the second peak point (2700 Å).

Also, in the fifth embodiment, the phosphorus oxide film 61 is formed, the thermal oxidation is performed for the phosphorus oxide film 61 as a diffusing processing, the capacitor thermal oxidation is performed, the photo-etching for the thin film is performed, the aluminum wire formation is performed, and the silicon nodule etching is performed. However, all manufacturing steps described above are not necessarily required. That is, the manufacturing steps required to manufacture a photo-sensor are determined by one or more devices formed on the silicon substrate 1. Therefore, because the increase or decrease of the combined oxide film depends on the manufacturing steps actually performed to manufacture a photo-sensor, a film thickness of the combined oxide film obtained before any of the above manufacturing steps is not performed is set in advance to target the film thickness of the combined oxide film obtained after the above manufacturing steps for the second peak point (2700 Å).

Also, any element is not arranged on the silicon nitride film 63 shown in FIG. 44. However, there is a case that a transparent mold material made of epoxy resin or gel is arranged on the silicon nitride film 63.

Having illustrated and described the principles of the present invention in a preferred embodiment thereof, it should be readily apparent to those skilled in the art that the invention can be modified in arrangement and detail without departing from such principles. We claim all modifications coming within the scope of the accompanying claims.

What is claimed is:

1. A method for manufacturing a photo-sensor in which light received in a light receiving element is converted into a photoelectric current in a photoelectric transfer device and the photoelectric current is processed in a signal processing circuit, comprising the steps of;

forming the photoelectric transfer device having the light receiving element in a semiconductor substrate;

forming the signal processing circuit in the semiconductor substrate;

forming a first insulating film on the light receiving element of the photoelectric transfer device;

forming a first metallic film, which is made of a metallic material different from a material of the first insulating film, on the semiconductor substrate to cover the signal processing circuit and the first insulating film with the first metallic film;

patterning the first metallic film to make a wire connected with the signal processing circuit and a protective film arranged on the first insulating film;

forming a second insulating film on the semiconductor substrate to cover the signal processing circuit, the wire and the protective film made of the patterned first metallic film with the second insulating film;

removing a portion of the second insulating film placed on the protective film;

forming a second metallic film on the semiconductor substrate to cover the second insulating film and the protective film with the second metallic film;

etching a portion of the second metallic film placed on the protective film to remove the portion of the second metallic film; and etching the protective film arranged on the first insulating film to remove the protective film.

2. A method for manufacturing a photo-sensor in which light received in a light receiving element is converted into a photoelectric current in a photoelectric transfer device and the photoelectric current is processed in a signal processing circuit, comprising the steps of;

forming the photoelectric transfer device having the light receiving element in a semiconductor substrate;

forming the signal processing circuit in the semiconductor substrate;

forming a first insulating film on the light receiving element of the photoelectric transfer device;

forming a first metallic film, which is made of a metallic material different from a material of the first insulating film, on the semiconductor substrate to cover the signal processing circuit and the first insulating film with the first metallic film;

patterning the first metallic film to make a wire connected with the signal processing circuit and a protective film arranged on the first insulating film;

forming a second insulating film on the semiconductor substrate to cover the signal processing circuit, the wire and the protective film made of the patterned first metallic film with the second insulating film;

forming a second metallic film on the second insulating film;

etching a portion of the second metallic film placed above the light receiving element to remove the portion of the second metallic film; and etching a portion of the second insulating film placed above the light receiving element and the protective film placed above the light receiving element to remove the portion of the second insulating film and the protective film.

3. A method for manufacturing a photo-sensor according to claim 1, further comprising the steps of:

arranging a laser trim adjusting thin-film resistive element on the semiconductor substrate;

additionally forming the second insulating film on the laser trim adjusting thin-film resistive element in the step of forming a second insulating film on the semiconductor substrate;

additionally forming the second metallic film above the laser trim adjusting thin-film resistive element in the step of forming a second metallic film on the semiconductor substrate;

forming a third insulating film on the second metallic film before the step of etching a portion of the second metallic film;

removing a first portion of the third insulating film placed above the light receiving element and a second portion of the third insulating film placed above the laser trim adjusting thin-film resistive element; and additionally etching a second portion of the second metallic film placed above the laser trim adjusting thin-film resistive element in the step of etching a portion of the second metallic film to remove the second portion of the second metallic film.

4. A method for manufacturing a photo-sensor according to claim 3 in which the portion of the second metallic film placed above the light receiving element and the second portion of the second metallic film placed above the laser trim adjusting thin-film resistive element are simultaneously etched and removed.

5. A method for manufacturing a photo-sensor according to claim 2, further comprising the steps of:

arranging a laser trim adjusting thin-film resistive element on the semiconductor substrate;

additionally forming the second insulating film on the laser trim adjusting thin-film resistive element in the step of forming a second insulating film on the semiconductor substrate;

additionally forming the second metallic film above the laser trim adjusting thin-film resistive element in the step of forming a second metallic film on the second insulating film;

remaining a second portion of the second metallic film placed above the laser trim adjusting thin-film resistive element in the step of etching a portion of the second metallic film;

forming a third insulating film on the second metallic film after the step of etching a portion of the second metallic film;

removing a first portion of the third insulating film placed above the light receiving element and a second portion of the third insulating film placed above the laser trim adjusting thin-film resistive element; and additionally etching a second portion of the second metallic film placed above the laser trim adjusting thin-film resistive element in the step of etching a portion of the second metallic film to remove the second portion of the second metallic film.

6. A method for manufacturing a photo-sensor according to claim 5 in which the portion of the first metallic film placed above the light receiving element and the second portion of the second metallic film placed above the laser trim adjusting thin-film resistive element are simultaneously etched and removed.

7. A method for manufacturing a photo-sensor according to claim 1 in which the first insulating film is formed by thermally oxidizing a portion of the semiconductor substrate placed on the light receiving element of the photoelectric transfer device.

8. A method for manufacturing a photo-sensor according to claim 2 in which the first insulating film is formed by thermally oxidizing a portion of the semiconductor substrate placed on the light receiving element of the photoelectric transfer device.

9. A method for manufacturing a photo-sensor according to claim 1 in which the first metallic film is made of a material possible to be etched in a particular etching method and the second metallic film is made of the same material or another material possible to be etched in the particular etching method.

10. A method for manufacturing a photo-sensor according to claim 2 in which the first metallic film is made of a material possible to be etched by a particular etching means and the second metallic film is made of the same material or another material possible to be etched by the particular etching means.

11. A method for manufacturing a photo-sensor according to claim 1 in which a material of the first metallic film is the same as that of the second metallic film.

12. A method for manufacturing a photo-sensor according to claim 2 in which a material of the first metallic film is the same as that of the second metallic film.

13. A method for manufacturing a photo-sensor in which light received in a light receiving element is converted into a photoelectric current in a photoelectric transfer device and the photoelectric current is processed in a signal processing circuit, comprising the steps of;

forming the photoelectric transfer device having the light receiving element in a semiconductor substrate;

forming the signal processing circuit in the semiconductor substrate;

forming a first insulating film on the light receiving element of the photoelectric transfer device;

forming a first metallic film on the semiconductor substrate to cover the signal processing circuit and the first insulating film with the first metallic film;

patterning the first metallic film to make a wire connected with the signal processing circuit and a protective film arranged on the first insulating film;

forming a second insulating film on the semiconductor substrate to cover the signal processing circuit, the wire and the protective film with the second insulating film;

forming a second metallic film on the second insulating film; and exposing the first insulating film, the step of exposing the first insulating film comprising the steps of
etching a portion of the second metallic film placed above the light receiving element to remove the portion of the second metallic film,
etching a portion of the second insulating film placed above the light receiving element to remove the portion of the second insulating film, and
etching the protective film placed on the first insulating film to remove the protective film.

14. A method for manufacturing a photo-sensor according to claim 1, further comprising the step of setting a film thickness of the insulating film to a particular peak value other than a maximum-peak value on condition that a light transmittance of the light transmitting through the insulating film set to a film thickness of the maximum-peak value is maximized according to a relationship between the light transmittance and the film thickness of the insulating film and the light transmittance in the neighborhood of the particular peak value gradually decreases as the film thickness of the insulating film becomes far from the particular peak value.

15. A method for manufacturing a photo-sensor according to claim 2, further comprising the step of setting a film thickness of the insulating film to a particular peak value other than a maximum-peak value on condition that a light transmittance of the light transmitting through the insulating film set to a film thickness of the maximum-peak value is maximized according to a relationship between the light transmittance and the film thickness of the insulating film and the light transmittance in the neighborhood of the particular peak value gradually decreases as the film thickness of the insulating film becomes far from the particular peak value.

16. A method for manufacturing a photo-sensor according to claim 13, further comprising the step of setting a film thickness of the insulating film to a particular peak value other than a maximum-peak value on condition that a light transmittance of the light transmitting through the insulating film set to a film thickness of the maximum-peak value is maximized according to a relationship between the light transmittance and the film thickness of the insulating film and the light transmittance in the neighborhood of the particular peak value gradually decreases as the film thickness of the insulating film becomes far from the particular peak value.

17. A method for manufacturing a photo-sensor, comprising the steps of;

forming a photoelectric transfer device having a light receiving element in a semiconductor substrate;

forming an insulating film on the light receiving element; and setting a film thickness of the insulating film to a particular peak value other than a maximum-peak value on condition that a light transmittance of light transmitting through the insulating film set to a film thickness of the maximum-peak value is maximized according to a relationship between the light transmittance and the film thickness of the insulating film and the light transmittance in the neighborhood of the particular peak value gradually decreases as the film thickness of the insulating film becomes far from the particular peak value.

18. A method for manufacturing a photo-sensor according to claim 17 in which the light transmittance of the light transmitting through the insulating film set to the film thickness of the particular peak value is a second highest value.

* * * * *